US010050040B2

(12) United States Patent
Yamakoshi

(10) Patent No.: US 10,050,040 B2
(45) Date of Patent: Aug. 14, 2018

(54) SEMICONDUCTOR NON-VOLATILE DRAM (NVDRAM) DEVICE

(71) Applicant: RENESAS ELECTRONICS CORPORATION, Tokyo (JP)

(72) Inventor: Hideaki Yamakoshi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/709,125

(22) Filed: Sep. 19, 2017

(65) Prior Publication Data

US 2018/0090501 A1 Mar. 29, 2018

(30) Foreign Application Priority Data

Sep. 29, 2016 (JP) ................... 2016-191656

(51) Int. Cl.
*H01L 27/108* (2006.01)
*G06F 1/30* (2006.01)
*G11C 7/10* (2006.01)
*G11C 11/4096* (2006.01)
*H01L 27/12* (2006.01)

(52) U.S. Cl.
CPC .......... *H01L 27/10852* (2013.01); *G06F 1/30* (2013.01); *G11C 7/1039* (2013.01); *G11C 11/4096* (2013.01); *H01L 27/10897* (2013.01); *H01L 27/1203* (2013.01)

(58) Field of Classification Search
CPC ........... H01L 27/10852; H01L 27/1203; H01L 27/10897; G11C 11/4096; G11C 7/1039; G06F 1/30
See application file for complete search history.

(56) References Cited

U.S. PATENT DOCUMENTS

| 5,196,722 A * | 3/1993 | Bergendahl ........... H01L 27/105 257/304 |
| 6,798,008 B2 * | 9/2004 | Choi ..................... G11C 14/00 257/296 |
| 8,792,275 B2 | 7/2014 | Shih et al. |
| 2017/0047098 A1 * | 2/2017 | Roy .................... G11C 14/0045 |

OTHER PUBLICATIONS

Michael Fliesler et al., "A 15ns 4Mb NVSRAM in 0.13u SONOS Technology", 2008 Joint Non-Volatile Semiconductor Memory Workshop and International Conference on Memory Technology and Design, p. 83-86.

* cited by examiner

*Primary Examiner* — Ajay Ojha
(74) *Attorney, Agent, or Firm* — McDermott Will & Emery LLP

(57) ABSTRACT

A semiconductor device that can evacuate the information in a DRAM automatically at the time of power supply cutoff is provided. A memory cell includes a DRAM cell that holds information at a storage node, a nonvolatile memory cell, and a transistor. The nonvolatile memory cell holds information by use of the first threshold voltage as an erase state and the second threshold voltage as a write state, and shifts to the write state by a write voltage being applied in the erase state. The transistor selects whether or not to apply the write voltage (voltage of a write voltage line) to the nonvolatile memory cell according to the voltage level at the storage node of the DRAM cell.

17 Claims, 18 Drawing Sheets

SEMICONDUCTOR NON-VOLATILE DRAM (NVDRAM) DEVICE

CROSS-REFERENCE TO RELATED APPLICATIONS

The disclosure of Japanese Patent Application No. 2016-191656 filed on Sep. 29, 2016 including the specification, drawings, and abstract is incorporated herein by reference in entirety.

BACKGROUND

The present invention relates to a semiconductor device, specifically to a semiconductor device provided with a DRAM (Dynamic Random Access Memory), for example.

For example, Patent Literature 1 discloses an NVSRAM in which a programmable transistor, such as an SONOS (Silicon Oxide Nitride Oxide Silicon) transistor, is combined with an SRAM (Static Random Access Memory) cell. Specifically, a source of the programmable transistor is coupled to one end of an information holding node of the SRAM via a transistor, and a drain is coupled to a power supply voltage via a transistor. The one end of the information holding node of the SRAM is coupled to the other end of the information holding node via an inverter Non-patent Literature 1 discloses a configuration in which a programmable transistor provided at the one end of the above-described information holding node is provided also at the other end, instead of the inverter of Patent Literature 1.

(Patent Literature 1) U.S. Pat. No. 8,792,275

(Non-patent Literature 1) Michael Fliesler, et al.; "A 15 ns 4 Mb NVSRAM in 0.13μ SONOS Technology", 2008 Joint Non-Volatile Semiconductor Memory Workshop and International Conference on Memory Technology and Design, pp. 83-86.

SUMMARY

A DRAM has simple structure (1Tr1C) and is capable of speeding up and achieving a high level of integration (in other words, reduction of price per bit), in comparison with nonvolatile memories, such as a flash memory. However, the DRAM is a volatile memory; accordingly, the stored information may be lost when the power supply is cut off suddenly. Furthermore, in the DRAM, it is necessary to keep the power supply and to perform refresh operation, just for maintaining the information. Consequently, even in a period when no read operation and no write operation are performed for example, the electric power is consumed.

The present invention described by the following embodiments has been accomplished in view of the above, and the other issues and new features of the present invention will become clear from the present description and the accompanying drawings.

A semiconductor device according to one embodiment includes multiple word lines, multiple bit lines, and multiple memory cells coupled with the word lines and the bit lines. Each of the memory cells includes a DRAM cell that holds information at a storage node, a nonvolatile memory cell, and a first transistor. The nonvolatile memory cell holds information by use of a first threshold voltage as an erase state and a second threshold voltage as a write state, and shifts to the write state by a write voltage being applied in the erase state. The first transistor selects whether or not to apply the write voltage to the nonvolatile memory cell according to the voltage level at the storage node of the DRAM cell.

According to the one embodiment, it becomes possible to evacuate the information on the DRAM automatically at the time of power supply cutoff.

DETAILED DESCRIPTION

Figure 1:
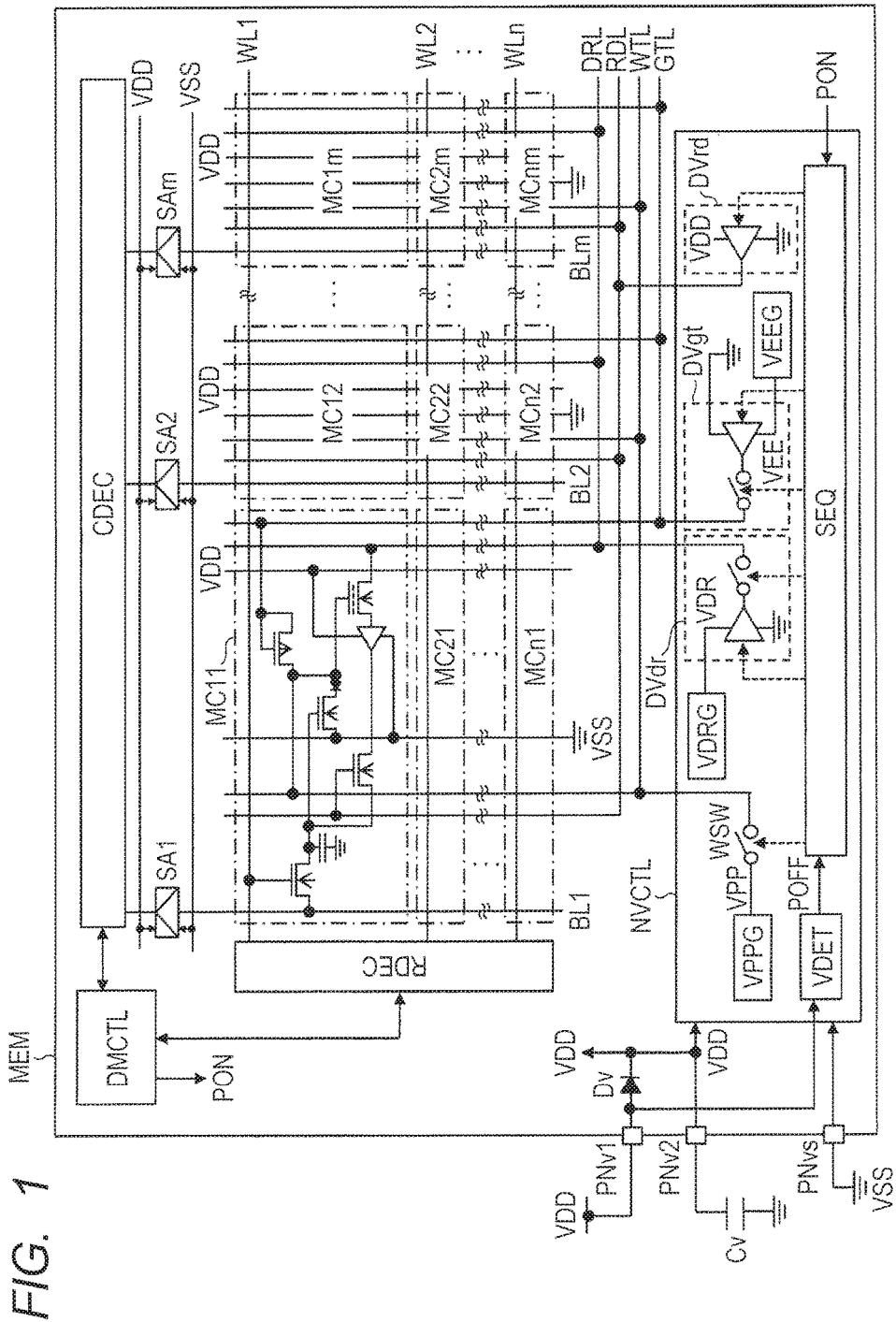
FIG. 1 is a schematic diagram illustrating an example of the configuration of a memory unit included in a semiconductor device according to Embodiment 1 of the present invention.

The following embodiment is explained by being split to several sections or embodiments when it is necessary for convenience. However, except when specified clearly in particular, the divided sections or embodiments are not mutually unrelated, however, one is regarded as a modified example, details, or a supplementary explanation of some or all of the other. When the number of elements (including the number, a numerical value, an amount, a range) are referred to in the following embodiment, it is not always restricted to the specific number of elements but it may be more or less than the specific number, except when it is specified clearly and when it is theoretically and clearly restricted to a specific number.

In the following embodiment, it is needless to say that the component (including an element step) is not necessarily indispensable except when it is specified clearly and when it is theoretically thought that it is clearly indispensable. Similarly, in the following embodiment, when describing the form, positional relationship, etc., of a component, etc., what resembles to or is substantially similar to the form, etc. shall be included, except when it is clearly specified and when it is considered theoretically that it is not so. Same applies to the numerical value and the range.

Although not restricted in particular, a circuit element that composes each functional block of the embodiments is formed on a semiconductor substrate such as single crystal silicon by employing the well-known CMOS (complementary MOS transistor) integrated circuits technology. In the present embodiments, a MOSFET (Metal Oxide Semiconductor Field Effect Transistor) (abbreviated as a MOS transistor) is employed, as an example of a MISFET (Metal Insulator Semiconductor Field Effect Transistor). However, it does not suggest exclusion of a non-oxide film as a gate insulating film.

In the present embodiments, an n-channel MOS transistor is called an NMOS transistor, and a p-channel MOS transistor is called a PMOS transistor. Coupling of a substrate potential of a MOS transistor is not indicated in particular in the drawings. However, the coupling method is not restricted in particular as far as it enables a normal operation of the MOS transistor. Representatively, the substrate potential of both the NMOS transistor and the PMOS transistor is coupled to the source potential.

Hereinafter, the embodiment of the present invention is described in detail, with reference to the drawings. In the entire diagrams to explain the embodiments of the present invention, the same symbol is attached to the same element in principle, and the repeated explanation thereof is omitted.

Embodiment 1

<<The Configuration of a Semiconductor Device>>

FIG. 1 is a schematic diagram illustrating an example of the configuration of a memory unit included in a semiconductor device according to Embodiment 1 of the present invention. In the memory unit MEM illustrated in FIG. 1, a power supply voltage (a high-potential-side power supply voltage) VDD is supplied to an external terminal PNv1, a reference supply voltage (a low-potential-side power supply voltage) VSS is supplied to an external terminal PNvs, and an external capacitor Cv is coupled to an external terminal PNv2.

A diode Dv is coupled between the external terminal PNv1 and the external terminal PNv2, with an anode on the side of the external terminal PNv1 and a cathode on the side of the external terminal PNv2. The power supply voltage VDD from the external terminal PNv1 is supplied to each circuit of the memory unit MEM via the diode Dv, and at the same time, it is held in the external capacitor Cv via the external terminal PNv2. For example, when the power supply voltage VDD from the external terminal PNv1 is cut off, the supply of the power supply voltage VDD is maintained with the external capacitor Cv for predetermined period of time.

The memory unit MEM illustrated in FIG. 1 includes multiple (n-piece) word lines WL1-WLn, multiple (m-piece) bit lines BL1-BLm, and multiple memory cells MC11-MCnm, coupled to the word lines WL1-WLn and the bit lines BL1-BLm. In the present description, each of the word lines WL1-WLn is generically called a word line WL, each of the bit lines BL1-BLm is generically called a bit line BL, and each of the memory cells MC11-MCnm is generically called a memory cell MC.

Each of the memory cells MC11-MCnm is arranged at the intersection of a predetermined word line WL among the word lines WL1-WLn and a predetermined bit line BL among the bit lines BL1-BLm, and is coupled to the predetermined word line WL concerned and the predetermined bit line BL concerned. For example, the memory ell. MC11 is coupled to the word line WL1 and the bit line BL1. Similarly, the memory cell MCnm is coupled to the word line WLn and the bit line BLm.

A DRAM controller DMCTL controls a row decoder RDEC and a column decoder CDEC, according to a read instruction including an address and a write instruction including an address and data, supplied from the exterior. The DRAM controller DMCTL asserts a power-on detection signal PON when the input of the power supply voltage VDD is detected. The row decoder RDEC selects one of the word lines WL1-WLn according to the address externally supplied and activates the selected word line WL concerned via a word driver (not shown). In response to the activation of the word line WL, information ('1' signal/'0' signal) of the memory cells MC coupled to the word line WL concerned is read to the bit lines BL1-BLm.

The bit lines BL1-BLm are respectively coupled to sense amplifier circuits SA1-SAm that operate by the power supply voltage VDD and the reference supply voltage VSS, for example. In the present description, each of the sense amplifier circuits SA1-SAm is generically called a sense amplifier circuit SA. The sense amplifier circuits SA1-SAm respectively amplify the voltage signal read to the bit lines BL1-BLm and output the '1' signal at the level of the power supply voltage VDD or the '0' signal at the level of the reference supply voltage VSS. The column decoder CDEC selects one of the bit lines BL1-BLm (the sense amplifier circuits SA1-SAm) according to the address supplied externally.

In the read operation, the column decoder CDEC outputs an output signal of the selected sense amplifier circuit SA to the DRAM controller DMCTL. In response to this, the DRAM controller DMCTL outputs the read data to the exterior. On the other hand, in the write operation, the column decoder CDEC rewrites the data of the selected bit line BL (the sense amplifier circuit SA) to the data accompanying the write instruction via a write driver (not shown).

Here, the memory unit MEM includes a terminal control line DRL, a write-back control line RDL, a write voltage line WTL, and a gate control line GTL, in common to the memory cells MC11-MCnm. Each of the lines is driven by the nonvolatile memory controller NVCTL. The nonvolatile memory controller NVCTL includes a power-off detection circuit VDET, a write voltage generating circuit VPPG, a read voltage generating circuit VDRG, an erase voltage generating circuit VEEG, a write switch WSW, a terminal driver DVdr, a gate driver DVgt, a write-back gate driver DVrd, and a sequencer SEQ.

The power-off detection circuit VDET monitors the power supply voltage VDD at the external terminal PNv1 and detects the power cutoff. Although not restricted in particular, the power-off detection circuit VDET is comprised of a comparator, and asserts a power-off detection signal POFF when the state where the voltage value at the external terminal PNv1 is less than a predetermined judgment voltage has continued for a predetermined period of time. The write voltage generating circuit VPPG is a step-up circuit and steps up the power supply voltage VDD to generate a write voltage VPP higher than the power supply voltage VDD.

The read voltage generating circuit VDRG generates a read voltage VDR required at the time of read of the nonvolatile memory. The erase voltage generating circuit VEEG is a negative voltage generation circuit, and generates an erase voltage VEE of a potential lower than the reference supply voltage VSS, employing the power supply voltage VDD. Although not restricted in particular, with reference to the reference supply voltage set to 0V, the power supply voltage VDD is set to 1.5V, the write voltage VPP is set to 10V, the read voltage VDR is set to 1.5V, and the erase voltage VEE is set to −10V.

The write switch WSW is coupled between the write voltage generating circuit VPPG and the write voltage line WTL, and applies the write voltage VPP to the write voltage line WTL, or controls the write voltage line WTL to the high impedance (hereinafter abbreviated as HiZ). The terminal driver DVdr is coupled between the read voltage generating circuit VDRG and the terminal control line DRL, and controls the terminal control line DRL to one of the read voltage VDR, the reference supply voltage VSS, and the HiZ. The gate driver DVgt is coupled between the erase voltage generating circuit VEEG and the gate control line GTL, and controls the gate control line GTL to one of the reference supply voltage VSS, the erase voltage VEE, and the HiZ. The write-back gate driver DVrd controls the write-back control line RDL to one of the power supply voltage VDD and the reference supply voltage VSS.

The sequencer SEQ operates in one of a program mode (write mode), an erasing mode, a read mode (write-back mode), and a standby mode. The sequencer SEQ controls the voltage of each control line (DRL, RDL, WTL, GTL), via the write switch WSW and each driver (DVdr, DVgt, DVrd) described above, according to the respective mode. For example, the sequencer SEQ shifts to the program mode in response to the assertion of the power-off detection signal POFF, and shifts to the read mode in response to the assertion of the power-on detection signal PON.

Figure 2:
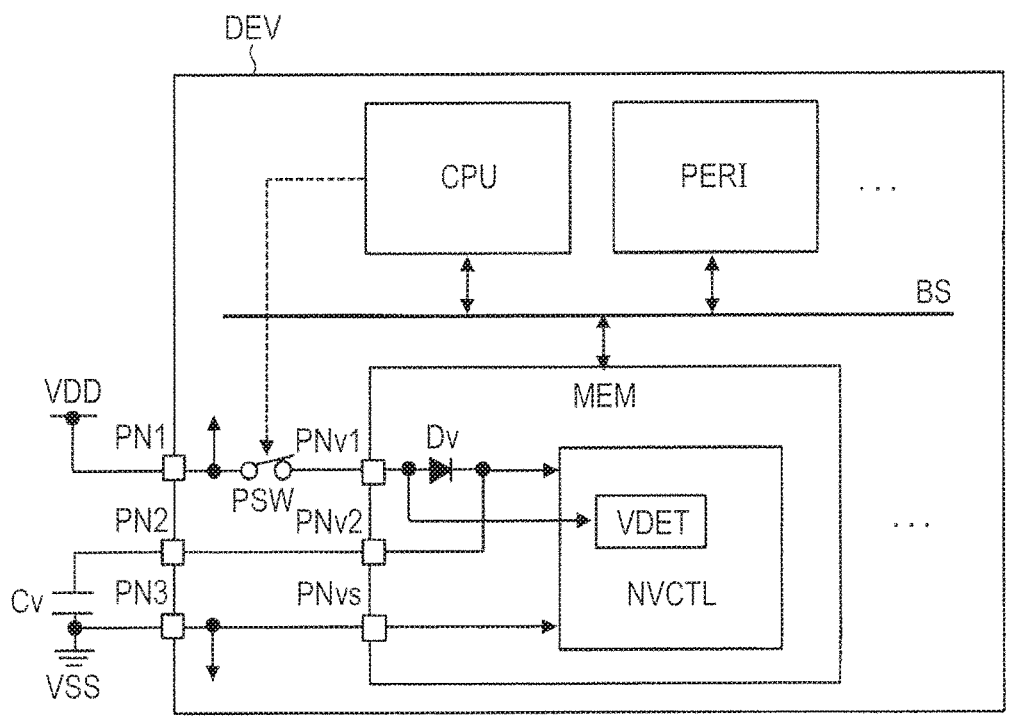
FIG. 2 is a schematic diagram illustrating an example of the configuration of a semiconductor device including the memory unit illustrated in FIG. 1.

FIG. 2 is a schematic diagram illustrating an example of the configuration of a semiconductor device including the memory unit illustrated in FIG. 1. The memory unit MEM illustrated in FIG. 1 may be a discrete part (a semiconductor device) comprised of one semiconductor chip, or may be one of the circuit units included in the semiconductor device DEV as illustrated in FIG. 2. The semiconductor device DEV illustrated in FIG. 2 is a micro controller comprised of one semiconductor chip for example, and includes an internal bus BS, and a CPU (Central Processing Unit), various kinds of peripheral circuits PERI, and the memory unit MEM such as illustrated in FIG. 1, which are coupled to the internal bus BS. Typically, the various kinds of peripheral circuits PERI include a communication circuit to communicate with the exterior, an ADC (Analog to Digital Converter), and a DAC (Digital to Analog Converter).

The external terminals PNv1, PNv2, and PNvs of the memory unit MEM are respectively coupled to external terminals PN1, PN2, and PN3 of the semiconductor device DEV. The power supply voltage VDD is supplied to the external terminal PN1, the external capacitor Cv is coupled to the external terminal PN2, and the reference supply voltage VSS is supplied to the external terminal PN3. In the present case, a power switch PSW is coupled between the external terminal PN1 of the semiconductor device DEV and the external terminal PNv1 of the memory unit MEM.

Although not restricted in particular, ON/OFF of the power switch PSW is controlled by the CPU. That is, the CPU can control the power switch PSW to OFF to cut off the power supply to the memory unit MEM, in a period when the read access and the w access are not performed to the memory unit MEM. However, in the memory unit MEM according to the present embodiment, even when the power supply is cut off, it is possible to hold the information written before the power supply cutoff, as will be described later for details.

<<The Configuration of a Memory Cell (Comparative Example)>>

Figure 18:
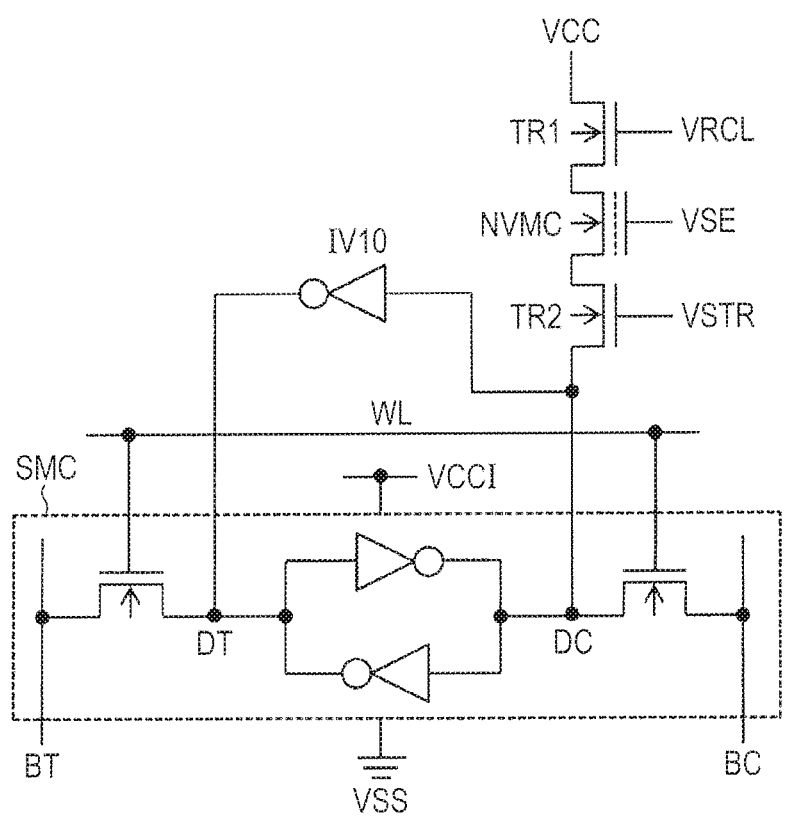
FIG. 18 is a circuit diagram illustrating an example of the configuration of a memory cell of a semiconductor device as a comparative example of the present invention.

FIG. 18 is a circuit diagram illustrating an example of the configuration of a memory cell of a semiconductor device as a comparative example of the present invention. FIG. 18 illustrates an example of the configuration of the memory cell that combines a nonvolatile memory cell NVMC with an SRAM cell SMC. A source of the nonvolatile memory cell NVMC is coupled to one information holding node DC of the SRAM cell SMC via a transistor TR2. A drain of the nonvolatile memory cell NVMC is coupled to the power supply voltage VCC via a transistor TR1. The one information holding node DC of the SRAM cell SMC is coupled to the other information holding node DT via an invert IV10.

For example, when the information of the SRAM cell SMC is written to the nonvolatile memory cell NVMC, at first the erasing of the nonvolatile memory cell NVMC is performed, then the write to the nonvolatile memory cell NVMC is performed. At the time of erasing, an erase voltage is applied to agate (VSE) of the nonvolatile memory cell NVMC. At the time of write, the transistor TR1 is controlled to OFF and the transistor TR2 is controlled to ON, and a write voltage is applied to the gate (VSE) of the nonvolatile memory cell NVMC. According to the difference voltage of the write voltage concerned and the voltage at the information holding node DC, the nonvolatile memory cell NVMC shifts to the write state, or maintains the erase state.

When the information of the nonvolatile memory cell NVMC is read to the SRAM cell SMC, on the other hand, at first, the power supply voltage VCCI of the SRAM cell SMC is cut off, the word line WL is activated temporarily in the state where the bit lines BT and BC are set to 0V, and the information holding nodes DT and DC are set to 0V. Subsequently, the transistors TR1 and TR2 are controlled to ON. When the nonvolatile memory cell NVMC is in an erase state, the information holding node DC is charged from 0V. When the nonvolatile memory cell NVMC is in a write state, the information holding node DC maintains 0V, and alternatively the information holding node DT is charged via the inverter IV10. By switching on the power supply voltage VCCI of the SRAM cell SMC in this state, complementary information is latched at the information holding nodes DT and DC.

In this way, the SRAM cell SMC is a latch-type memory cell. Accordingly, even if the power supply is maintained in the waiting period in which neither a write operation nor a read operation is performed, the power consumption is small, causing little problem. On the other hand, the DRAM requires a refresh operation even in the waiting period; accordingly, the power consumption can pose a problem. In the configuration as illustrated in FIG. 18, whether to perform the write is distinguished according to the difference voltage of the write voltage at the gate (VSE) and the voltage of information holding node DC. Accordingly, there is a possibility that the distinction may be difficult depending on voltage conditions. For example, when the write voltage is 10V and the power supply voltage VCCI is 1.5V, it is necessary to distinguish whether or not to perform the write, based on 10V or 8.5V.

<<The Configuration of the Memory Cell (Embodiment 1)>>

Figure 3:
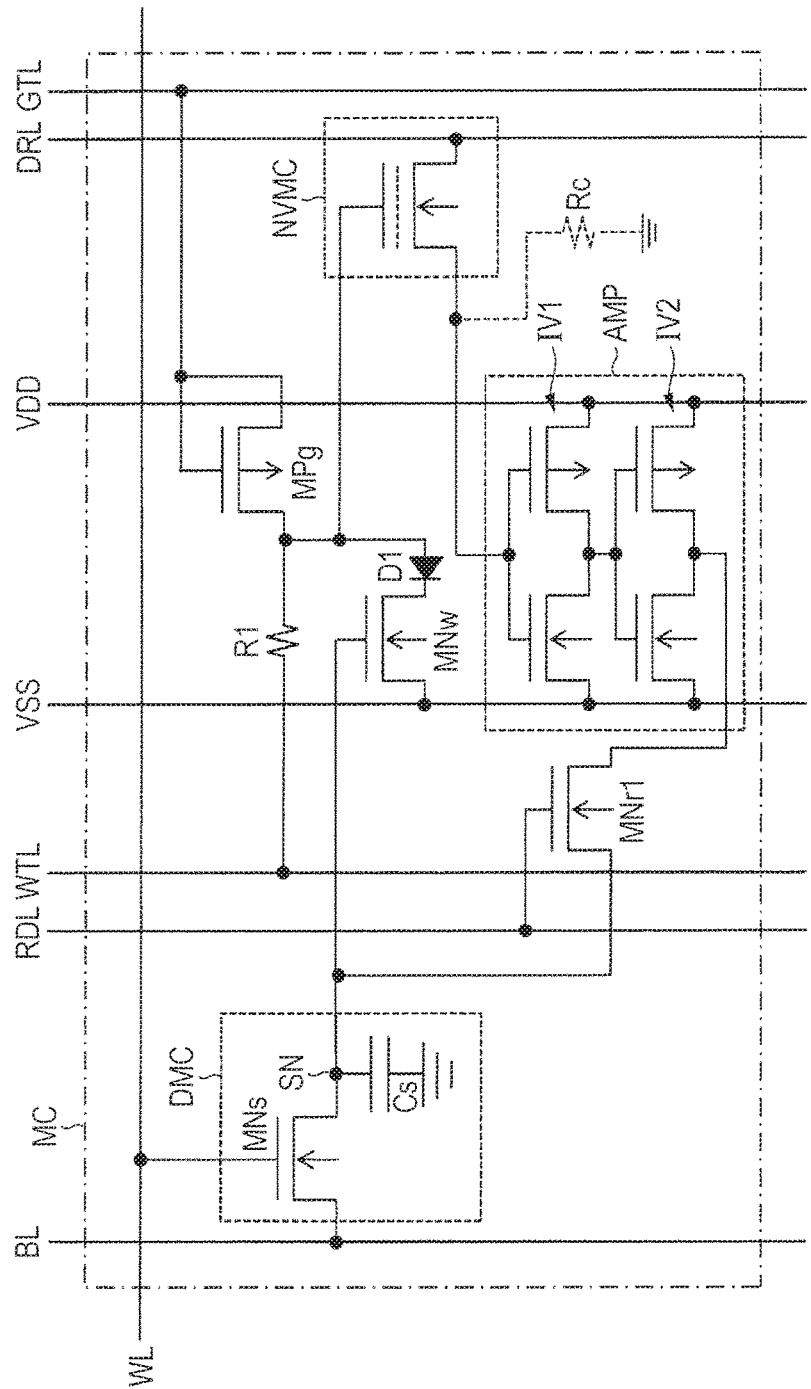
FIG. 3 is a circuit diagram illustrating an example of the configuration of the memory cell illustrated in FIG. 1.

FIG. 3 is a circuit diagram illustrating an example of the configuration of the memory cell illustrated in FIG. 1. The memory cell MC illustrated in FIG. 3 includes a DRAM cell DMC, a nonvolatile memory cell NVMC, and circuits that couple the DRAM cell DMC and the nonvolatile memory cell NVMC. The DRAM cell DMC includes a capacitor Cs that holds information at the storage node SN, and a control transistor (an NMOS transistor in the present example) MNs that couples a predetermined bit line BL and the storage node SN in response to activation of a predetermined word line WL.

The nonvolatile memory cell NVMC is a flash memory cell, for example, and although not restricted in particular, it is comprised of an MONOS (Metal Oxide Nitride Oxide Silicon) transistor. The nonvolatile memory cell NVMC holds information by use of a threshold voltage (−Vte) as an erase state and a threshold voltage (+Vtw) as a write state. The nonvolatile memory cell NVMC shifts to the write state when a write voltage VPP is applied in the erase state, and shifts to the erase state when an erase voltage VEE is applied in the write state.

The threshold voltage (−Vte) is a negative voltage value, and is −1.5V for example although not restricted in particular. On the other hand, the threshold voltage (+Vtw) is a positive voltage value, and is +1.5V for example although not restricted in particular. Usually, the erase state is associated with a '1' signal and the write state is associated with a '0' signal, respectively. One of a source and a drain (for example, a drain) of the nonvolatile memory cell NVMC is coupled to the terminal control line DRL. To the terminal control line DRL, a read voltage VDR is applied at the time of a read of the nonvolatile memory cell NVMC, and the reference supply voltage VSS is applied at the time of a write and an erasing, for example.

The memory cell MC includes a resistive element R1, transistors MNw, MNr1, and MPg, a diode D1, and an amplifier circuit AMP. The resistive element R1 is coupled between a gate of the nonvolatile memory cell NVMC and the write voltage line WTL, and has a value of resistance higher than the on-resistance of the transistor MNw. As illustrated in FIG. 1, a write voltage VPP is applied to the write voltage line WTL via the write switch WSW. The transistor MNw is an NMOS transistor for example, and selects whether or not to apply the write voltage VPP to the nonvolatile memory cell NVMC, according to the voltage level at the storage node SN of the DRAM cell DMC.

Specifically, the transistor MNw is coupled between the gate of nonvolatile memory cell NVMC and the reference supply voltage VSS, and ON/OFF of the transistor MNw is controlled by the voltage level at the storage node SN. Accordingly, the transistor MNw controls the gate voltage of the nonvolatile memory cell NVMC by the resistive subdivision of the write voltage VPP with the value of resistance of the resistive element R1 and the value of resistance between the drain and the source of the transistor MNw. The diode D1 is coupled between the gate of the nonvolatile memory cell NVMC and the transistor MNw, with an anode on the side of the gate of the nonvolatile memory cell NVMC and a cathode on the side of the transistor MNw.

The transistor MNr1 is an NMOS transistor for example, and is coupled between the storage node SN and the nonvolatile memory cell NVMC. The transistor MNr1 writes back the information read from the nonvolatile memory cell NVMC to the storage node SN, in response to the activation of the write-back control line RDL. The amplifier circuit AMP is provided between the transistor MNr1 and the other one of the source and the drain (the source in the present example) of the nonvolatile memory cell NVMC, and outputs a voltage corresponding to the level of '1' or '0' of the storage node SN, according to whether a read current flows through the nonvolatile memory cell NVMC. In the present example, the amplifier circuit AMP is comprised of two-stage CMOS inverters IV1 and IV2, and outputs the power supply voltage VDD corresponding to the level of '1' or the reference supply voltage VSS corresponding to the level of '0.'

The transistor MPg is a PMOS transistor for example, is coupled between the gate of the nonvolatile memory cell NVMC and the gate control line GTL, and is controlled to ON when shifting the nonvolatile memory cell NVMC to an erase state. In this case, an erase voltage VEE at the time of shifting the nonvolatile memory cell NVMC to the erase state is applied to the gate control line GTL. In the present example, the transistor MPg is a diode-connected PMOS transistor with an anode on the side of the gate of the nonvolatile memory cell NVMC and a cathode on the side of the gate control line GTL.

When reading information from the nonvolatile memory cell NVMC, it is necessary to apply the reference supply voltage VSS to the gate of the nonvolatile memory cell NVMC. Application of this reference supply voltage VSS is enabled from the gate control line GTL via the transistor MPg. Not restricted to this, however, it is also possible to apply the reference supply voltage VSS from the write voltage line WTL via the resistive element R1, by setting the write voltage line WTL to the reference supply voltage VSS, for example. In the present description, the gate control line GTL is employed for convenience.

<<Overall Operation of the Memory Unit>>

Figure 4:
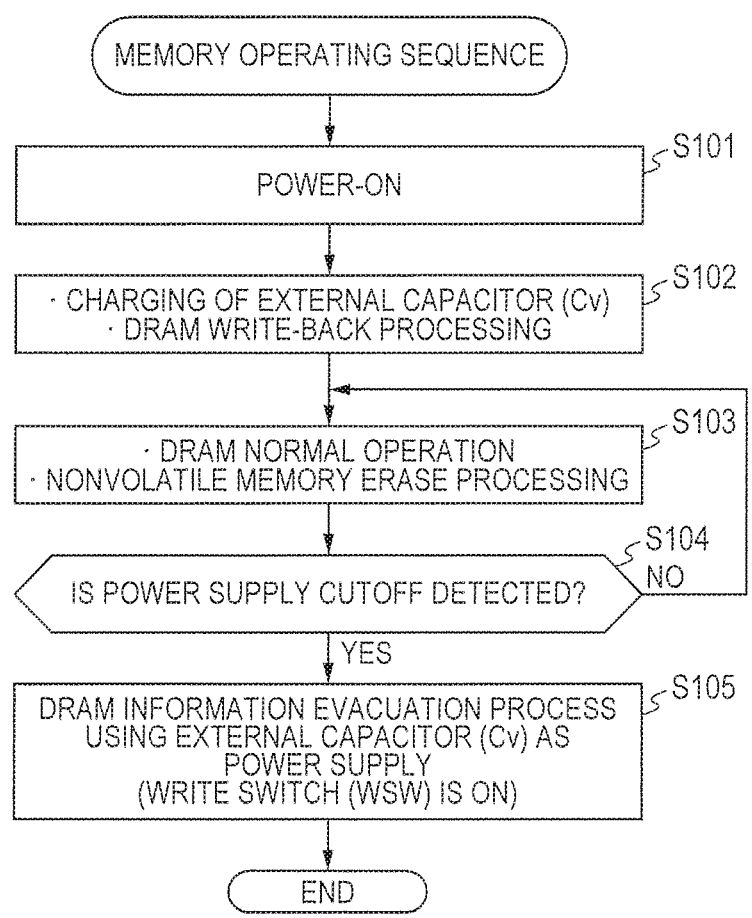
FIG. 4 is a flow chart illustrating an example of the overall operation of the memory unit illustrated in FIG. 1.

FIG. 4 is a flow chart illustrating an example of the overall operation of the memory unit illustrated in FIG. 1. In FIG. 4, the power supply voltage VDD is first supplied to the memory unit MEM (Step S101). The DRAM controller DMCTL detects the power-on concerned and asserts the power-on detection signal PON. The nonvolatile memory controller NVCTL (specifically, the sequencer SEQ) responds to the assertion of the power-on detection signal PON and performs a DRAM write-back processing (Step S102). Specifically, the sequencer SEQ shifts to a read mode (a write-back mode), and writes back the information of the nonvolatile memory cell NVMC to the DRAM cell DMC. When the power supply voltage VDD is switched on, electric charging of the external capacitor Cv is also performed automatically (Step S102).

For example, after the processing at Step S102, the sequencer SEQ notifies the DRAM controller DMCTL of the completion of the write-hack, and the flow shifts to the processing at Step S103. At Step S103, the DRAM controller DMCTL responds to the notice of the completion of the write-back, and shifts to the state where the DRAM can perform the normal operation. Specifically, the DRAM controller DMCTL receives a read instruction and a write instruction from the exterior for example, and enables a refresh operation. At Step S103, the sequencer SEQ shifts to the erasing mode and performs the erasing processing of the nonvolatile memory cell NVMC in parallel with the normal operation of the DRAM. The sequencer SEQ shifts to the standby mode when the erasing processing of the nonvolatile memory cell NVMC is completed.

The processing at step S103 like this continues until the power supply voltage VDD from the exterior is cut off (Step S104). When the power supply voltage VDD from the exterior is cut off, the power-off detection circuit VDET asserts a power-off detection signal POFF. The sequencer SEQ responds to the assertion of the power-off detection signal POFF and performs the DRAM information evacuation process by using the external capacitor Cv as the power supply (Step S105). Specifically, the sequencer SEQ shifts from the standby mode to the program mode (the write mode), and writes back the information of the DRAM cell DMC to the nonvolatile memory cell NVMC by controlling the write switch WSW to ON, for example.

<<Operation of the Memory Cell (Embodiment 1)>>

Figure 5:
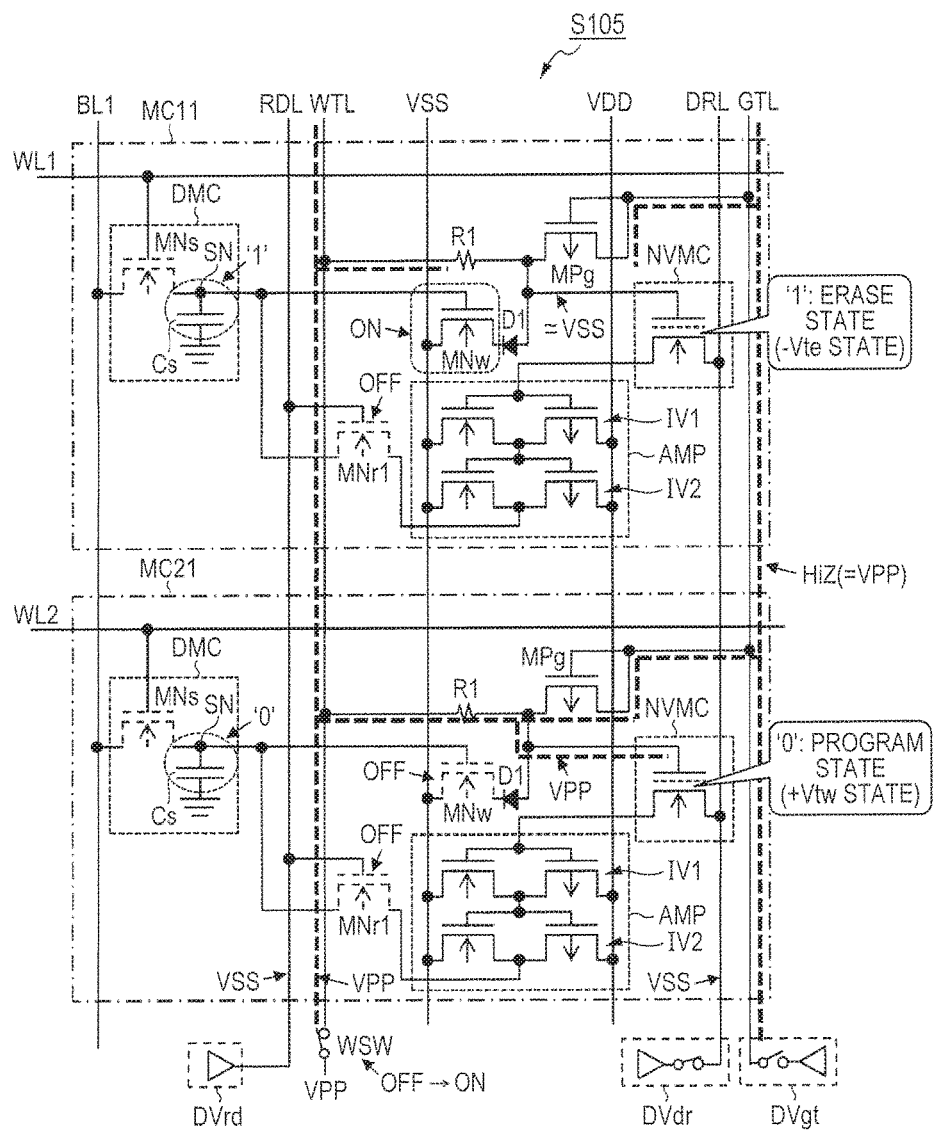
FIG. 5 is a drawing illustrating an example of the operation when the memory cell illustrated in FIG. 3 performs the DRAM information evacuation process illustrated in FIG. 4.

FIG. 5 illustrates an example of the operation when the memory cell illustrated in FIG. 3 performs the DRAM information evacuation process (Step S105) illustrated in FIG. 4. In FIG. 5, it is assumed that the power supply voltage VDD from the exterior is cut off, in the state where the storage node. SN of the memory cell MC11 holds '1' signal (the level of the power supply voltage VDD), and the storage node SN of the memory cell MC21 holds '0' signal (the level of the reference supply voltage VSS). Even when the power supply voltage VDD from the exterior is cut off, the power supply voltage VDD is supplied to the memory unit MEM by the external capacitor Cv for a predetermined period of time. Therefore, the DRAM memory cell DMC can also hold the information for the predetermined period of time.

First, following the processing at Step S103 illustrated in FIG. 4, each nonvolatile memory cell NVMC is in the erase state (the state of the threshold voltage (−Vte)) in advance. In the DRAM information evacuation process (the program mode), both the write-back control line RDL and the terminal control line DRL are driven to the reference supply voltage VSS, and the gate control line GTL is controlled to the HiZ. In this state, the write switch WSW is controlled to ON. In the memory cell MC11, the transistor MNw is ON due to the '1' signal at the storage node SN. Accordingly, the voltage of about the level of the reference supply voltage VSS is applied to the gate of the nonvolatile memory cell NVMC. Consequently, nonvolatile memory cell NVMC maintains the erase state ('1' signal).

On the other hand, in the memory cell MC21, the transistor MNw is OFF due to the '0' signal of the storage node SN. Therefore, the write voltage VPP is applied to the gate of the nonvolatile memory cell NVMC. Consequently, the nonvolatile memory cell NVMC shifts from the erase state to the write state (the state of the threshold voltage (+Vtw), the '0' signal). The write in this case is performed by the FN (Fowler Nordheim) tunneling method, for example. The write by the FN tunneling system requires a small electric current, as compared with the hot electron system, for example. Accordingly, it is possible to write fully by the power supply of the external capacitor Cv. It is also possible to reduce the power loss by the resistive element R1.

In the memory cell MC21, the write voltage VPP is transferred also to the gate control line GTL in the HiZ state via the transistor MPg. The diode-connected transistor MPg in the memory cell MC11 serves to cut of the conduction between the gate control line GTL at the level of the write voltage VPP and the gate of the nonvolatile memory cell NVMC at the level of about the reference supply voltage VSS.

Figure 6:
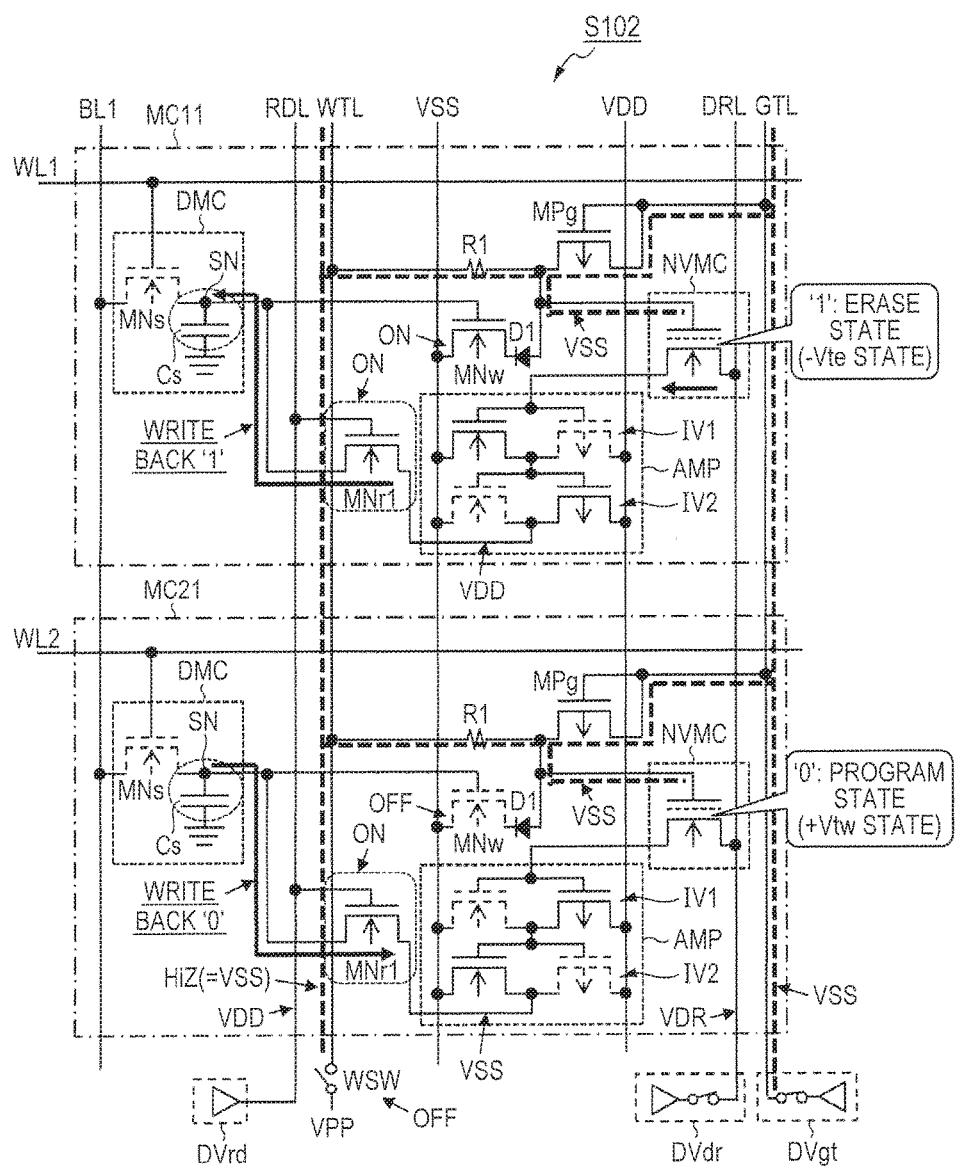
FIG. 6 is a drawing illustrating an example of the operation when the memory cell illustrated in FIG. 3 performs the DRAM write-back processing illustrated in FIG. 4.

FIG. 6 illustrates an example of the operation when the memory cell illustrated in FIG. 3 performs the DRAM write-back processing (Step S102) illustrated in FIG. 4. In FIG. 6, it is assumed that the power supply voltage VDD from the exterior is switched on, in the case where the nonvolatile memory cell NVMC of the memory cell MC11 is in the erase state (the '1' signal), and the nonvolatile memory cell NVMC of the memory cell MC21 is in the write state (the '0' signal). In the DRAM write-back processing (the read mode), the write voltage line WTL is controlled to the HiZ, the terminal control line DRL is driven to the read voltage VDR, and the gate control line GTL is driven to the reference supply voltage VSS. In this state, the write-back control line RDL is driven to the power supply voltage VDD.

The reference supply voltage VSS is applied to the gate of each nonvolatile memory cell NVMC from the gate control line GTL via the transistor MPg. In this case, the transistor MNw may be ON or may be OFF, according to the storage node SN. The write voltage line WTL at the HiZ is also driven to the reference supply voltage VSS, however, there is no particular influence on the operation. The read voltage VDR (for example, 1.5V) is applied to one of the source and the drain (the drain in the present example) of each nonvolatile memory cell NVMC via the terminal control line DRL.

In the memory cell MC11, the nonvolatile memory cell NVMC is in a threshold voltage (−Vte) state (for example, −Vte=−1.5V). Accordingly, the nonvolatile memory cell NVMC flows a read current and transfers the read voltage VDR to the other of the source and the drain (the source in the present example). The amplifier circuit AMP outputs a signal of the level of the power supply voltage VDD, in response to the source voltage of the nonvolatile memory cell NVMC concerned. The transistor MNr1 is controlled to ON according to the write-back control line RDL, and writes back the output voltage (that is, the '1' signal) of the amplifier circuit AMP to the storage node SN.

On the other hand, in the memory cell MC21, the nonvolatile memory cell NVMC is in a threshold voltage (+Vtw) state (for example, +Vtw=+1.5V). Accordingly, the nonvolatile memory cell NVMC does not make a read current flow. Consequently, the voltage at the other of the source and the drain (the source in the present example) is usually a value near the reference supply voltage VSS since it is immediately after the power-on. The amplifier circuit AMP outputs a signal of the level of the reference supply voltage VSS, in response to the source voltage of the nonvolatile memory cell NVMC concerned. The transistor MNr1 is controlled to ON according to the write-back control line RDL, and writes back the output voltage (that is, the '0' signal) of the amplifier circuit AMP to the storage node SN.

In the memory cell MC21, the source of the nonvolatile memory cell NVMC is at the HiZ, accordingly, it is usually set to the level of the reference supply voltage VSS. However, it is not always the case. Therefore, as illustrated in FIG. 3, the source of the nonvolatile memory cell NVMC may be coupled to the reference supply voltage VSS via a resistive element Rc. The value of resistance of the resistive element Rc is one or more orders of magnitude higher than the on-resistance of the nonvolatile memory cell NVMC in the erase state. Consequently, the source of the nonvolatile memory cell NVMC is set at the level the reference supply voltage VSS as the initial value, and is set at the level of the read voltage VDR for example, when the nonvolatile memory cell NVMC in the erase state f lows a read current.

The source voltage of the nonvolatile memory cell NVMC in the erase state changes in practice depending on the threshold voltage (−Vte). On the other hand, it is necessary to write back the signal of the level of the power supply voltage VDD or the level of the reference supply voltage VSS, to the storage node SN of the DRAM cell DMC. Accordingly, the amplifier circuit AMP is provided in the present example. The amplifier circuit AMP is not restricted to the configuration as illustrated in FIG. 3 in particular, and it is sufficient that the amplifier circuit AMP can amplify the input voltage to the level of the power supply voltage VDD or to the level of the reference supply voltage VSS.

Figure 7:
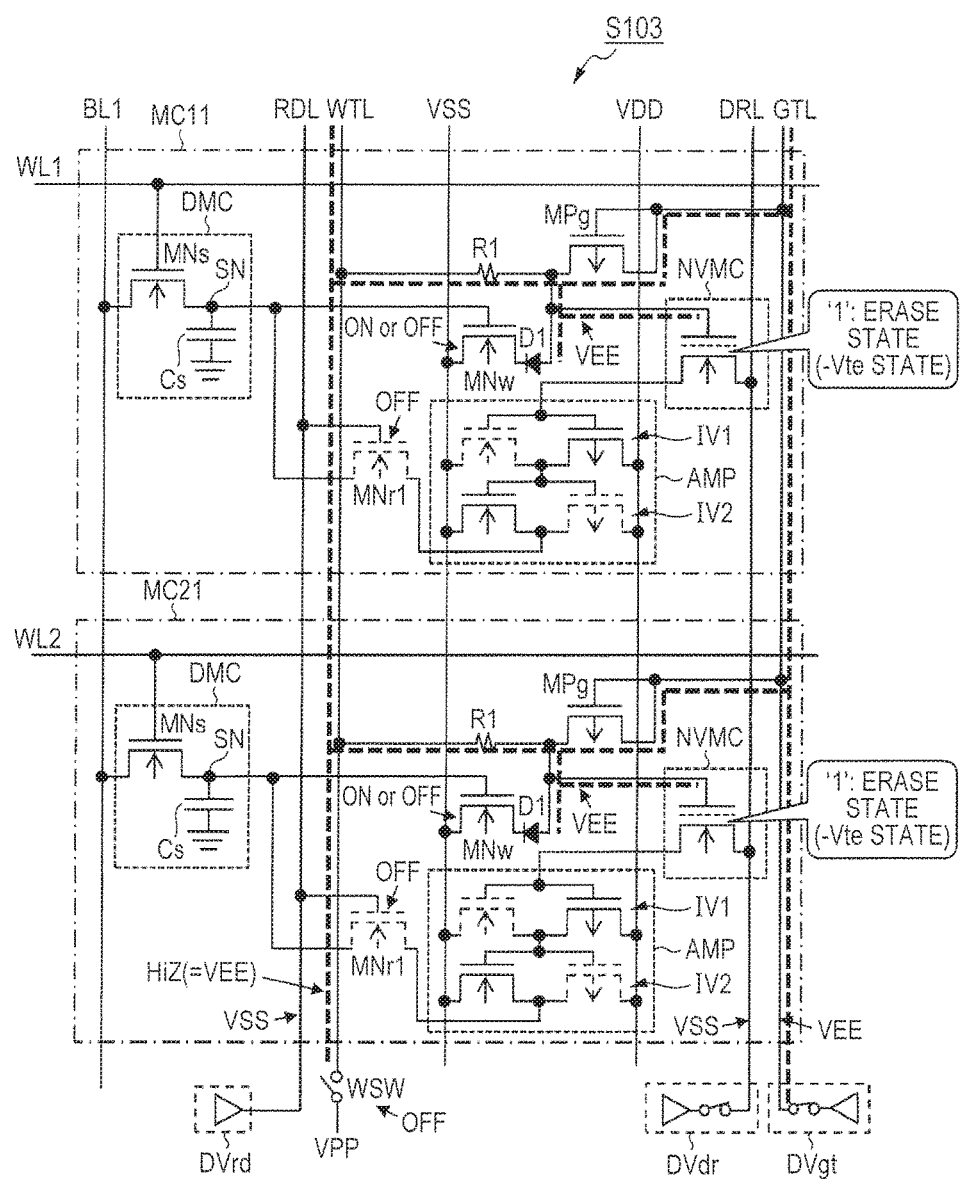
FIG. 7 is a drawing illustrating an example of the operation when the memory cell illustrated in FIG. 3 performs the nonvolatile memory erase processing illustrated in FIG. 4.

FIG. 7 illustrates an example of the operation when the memory cell illustrated in FIG. 3 performs the nonvolatile memory erase processing (Step S103) illustrated in FIG. 4. In the nonvolatile memory erase processing (the erasing mode), the write voltage line WTL is controlled to the HiZ and both the write-back control line RDL and the terminal control line DRL are driven to the reference supply voltage VSS. In this state, the gate control line GTL is driven to the erase voltage VEE.

The erase voltage VEE is applied to the gate of each nonvolatile memory cell NVMC from the gate control line GTL via the transistor MPg. Consequently, the nonvolatile memory cell NVMC in the write state shifts to the erase state, and the nonvolatile memory cell NVMC in the erase state maintains the erase state. The erasing in this case is performed by the FN tunneling system, for example. The write voltage line WTL at the HiZ is also driven to the erase voltage VEE; however, there is no particular influence on the operation. When the transistor MNw is ON, on the other hand, the gate voltage (the erase voltage VEE) of the nonvolatile memory cell NVMC will conduct with the reference supply voltage VSS. However, the diode D1 serves to cut off this conduction.

Figure 8:
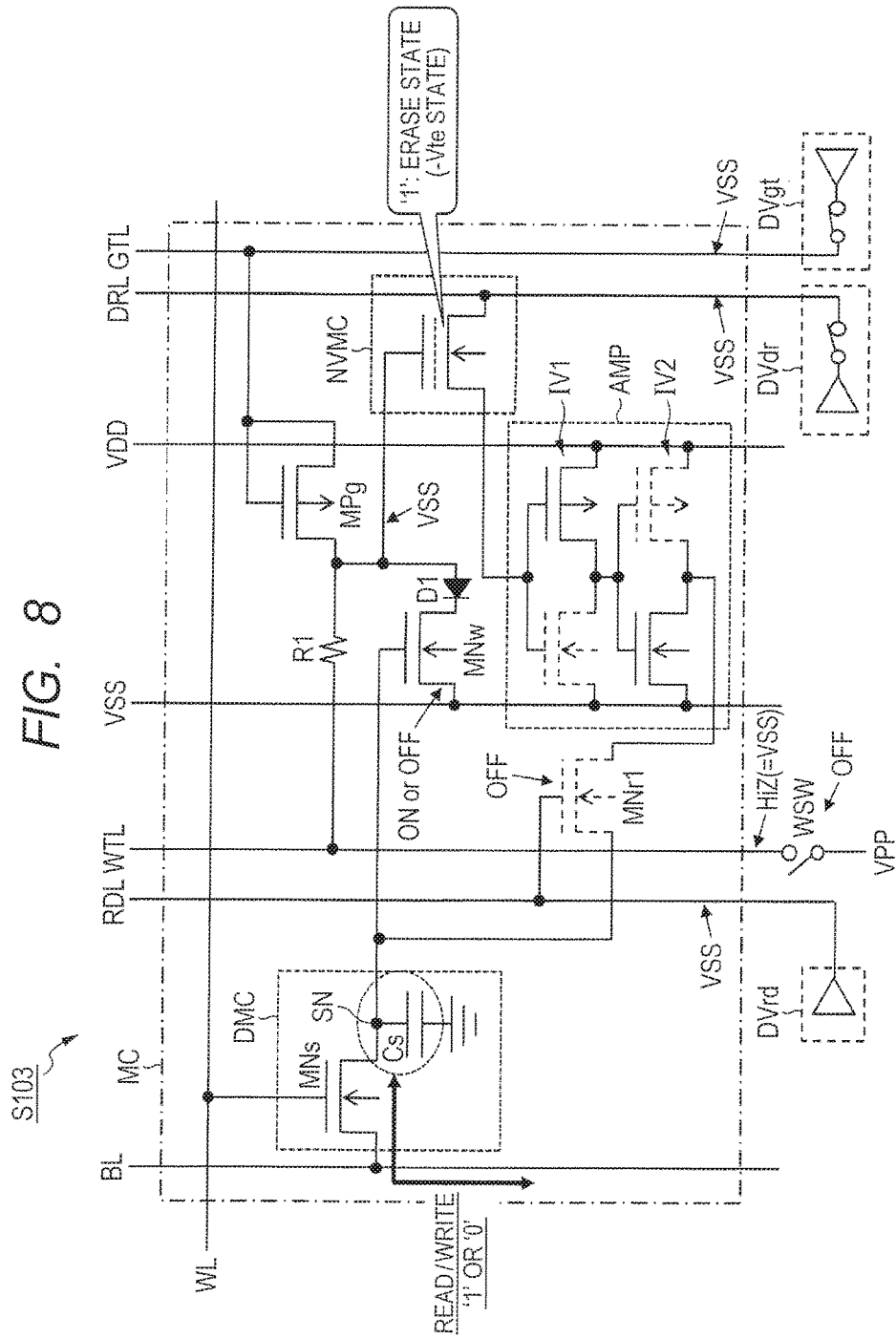
FIG. 8 is a drawing illustrating an example of the operation when the memory cell illustrated in FIG. 3 performs the DRAM normal operation illustrated in FIG. 4.

FIG. 8 illustrates an example of the operation when the memory cell illustrated in FIG. 3 performs the DRAM normal operation (Step S103) illustrated in FIG. 4. It is assumed here that the nonvolatile memory erase processing illustrated in FIG. 7 is already completed. However, even if the nonvolatile memory erase processing and the DRAM normal operation are performed in parallel, there is no problem in particular. In the DRAM normal operation, the sequencer SEQ illustrated in FIG. 1 operates in the standby mode. In the standby mode, the write voltage line WTL is controlled to the HiZ, and the write-back control line RDL, the terminal control line DRL, and the gate control line GTL are driven to the reference supply voltage VSS. In this state, the write to or the read from the DRAM cell DMC is performed properly.

<<The Main Device Structure of the Memory Cell (Embodiment 1)>>

Figure 9:
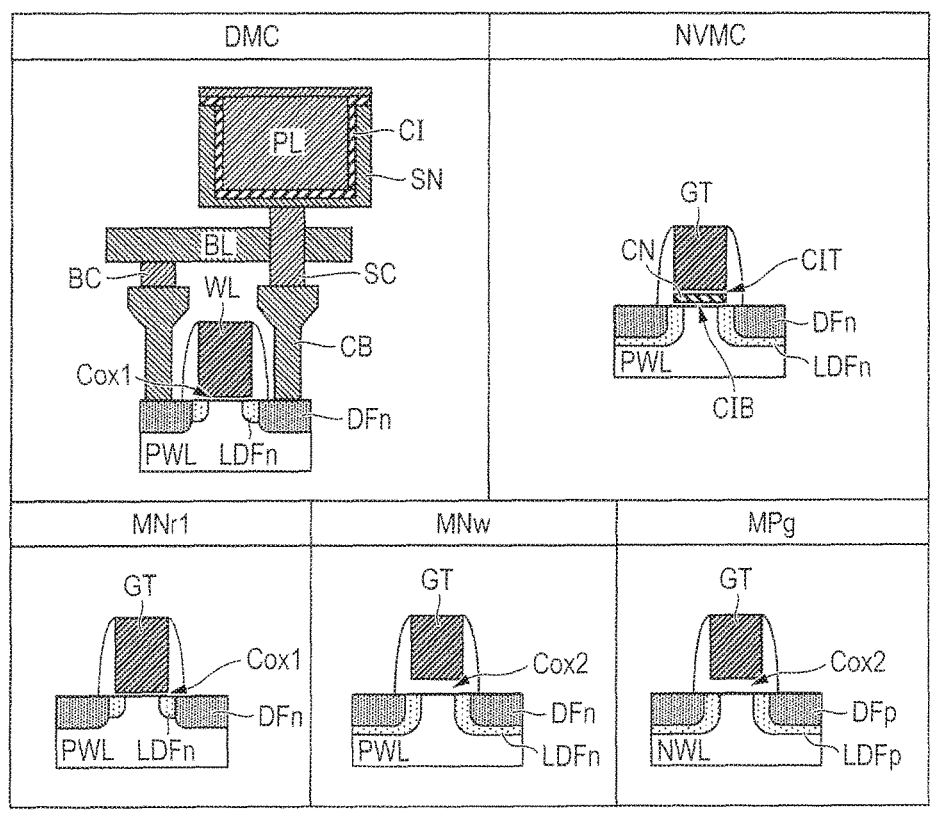
FIG. 9 is a sectional view illustrating an example of the main device structure in the memory cell illustrated in FIG. 3.

FIG. 9 is a sectional view illustrating an example of the main device structure in the memory cell illustrated in FIG. 3. FIG. 9 illustrates an example of the structure of the DRAM cell DMC, the nonvolatile memory cell NVMC, and the main transistors (MNr1, MNw, MPg). In the DRAM cell DMC, n-type diffusion layers DFn serving as a source and a drain are formed in a p-type well PWL. Low-concentration n-type diffusion layers LDFn are formed in the area sandwiched by two diffusion layers DFn and located inside the diffusion layers DFn.

A word line WL serving as a gate layer is arranged in the upper part of the area sandwiched by the two diffusion layers DFn, via a gate insulating film Cox1. In the upper part of one of the two diffusion layers DFn, a contact layer CB and a bit line contact layer BC are arranged in this order, and the bit line contact layer BC is coupled to a bit line BL serving as a metal wiring layer. In the upper part of the other of the two diffusion layers DFn, a contact layer CB and a storage node contact layer SC are arranged in this order. In the upper part of the storage node contact layer SC, a concave (cylinder-shaped) storage node SN formed over an inner wall of a hole of an interlayer insulation film (not shown) is arranged. Inside the storage node SN, a plate electrode PL is embedded through the intervention of an insulating film CI. Various structures of the DRAM cell DMC are known, and the structure is not restricted to the stack type structure described above in particular; alternatively, it may be a trench type structure.

In the nonvolatile memory cell NVMC, low-concentration n-type diffusion layers LDFn serving as a source and a drain are formed in the p-type well PWL, and n-type diffusion layers DFn are formed in the n-type diffusion layers LDFn. In the upper part of an area sandwiched by the two diffusion layers DFn (LDFn), a lower insulating film CIB serving as a silicon oxide, a silicon nitride film CN serving as a charge storage film, and an upper insulating film CIT serving as a silicon oxide are deposited in this order. A gate layer GT is deposited over the upper insulating film CIT. The nonvolatile memory cell NVMC is not restricted to the MONOS transistor such as described above, but may be a general flash memory transistor provided with a floating gate.

In the transistor (NMOS transistor) MNr1, n-type diffusion layers DFn serving as a source and a drain are formed in the p-type well PWL. Low-concentration n-type diffusion layers LDFn are formed in the area sandwiched by two diffusion layers DFn and located inside the diffusion layers DFn. A gate layer GT is arranged in the upper part of the area sandwiched by the two diffusion layers DFn, via a gate insulating film Cox1.

In the transistor (NMOS transistor) MNw, low-concentration n-type diffusion layers LDFn serving as a source and a drain are formed in the p-type well PWL, and n-type diffusion layers DFn are formed in the n-type diffusion layers LDFn. A gate layer GT is arranged in the upper part of the area sandwiched by the two diffusion layers DFn (LDFn), via a gate insulating film Cox2. Here, the film thickness of the gate insulating film Cox2 is thicker than the film thickness of the gate insulating film Cox1 in the transistor MNr1 or the control transistor (MNs illustrated in FIG. 2) of the DRAM cell DMC. This is because the transistor MNw is required to have the withstand voltage of the level of the write voltage VPP, in comparison with the fact that the transistor MNr1 is required only to have the withstand voltage of the level of the power supply voltage VDD.

In the transistor (PMOS transistor) MPg, low-concentration p-type diffusion layers LDFp serving as a source and a drain are formed in the n-type well NWL, and p-type diffusion layers DFp are formed in the p-type diffusion layers LDFp. A gate layer GT is arranged in the upper part of the area sandwiched by the two diffusion layers DFp (LDFp), via a gate insulating film Cox2. The transistor MPg is also required to have the withstand voltage of the level of the erase voltage VEE or the level of the write voltage VPP. Accordingly, the thick gate insulating film Cox2 is employed.

Although no diagram is presented, the resistive element R1 illustrated in FIG. 3 is formed with polysilicon or a diffusion layer and the resistive element Rc is formed with polysilicon, for example. The diode D1 is comprised of a pn junction diode employing a diffusion layer, or a diode-connected transistor (for example, a transistor similar to MNw), for example. Each transistor composing the amplifier circuit AMP is comprised of an NMOS transistor similar to the transistor MNr1 and a PMOS transistor with the opposite polarity of the NMOS transistor concerned.

<<The Main Effects of Embodiment 1>>

In the above, it becomes possible to evacuate the information of the DRAM automatically at the time of power supply cutoff, by employing the semiconductor device according to Embodiment 1. It becomes also possible to write back the evacuated information to the DRAM automatically at the time of power supply resumption. Consequently, it is possible to stop properly the power supply in the waiting period of the DRAM for example, and it is possible to reduce the power consumption accompanying the refresh operation, etc.

Different from the example of the configuration illustrated in FIG. 18, in the present system, the ON/OFF of the transistor MNw is controlled according to the voltage at the storage node SN, and the reference supply voltage VSS or the write voltage VPP is applied according to the ON/OFF concerned. Accordingly, it is possible to distinguish the occurrence or non-occurrence of the write clearly. Contrary to the case as illustrated in FIG. 18, the erasing and the write of the nonvolatile memory cell NVMC are not performed continuously, but the write is performed at the time of the power supply cutoff, and the erasing is performed after the power-on. Consequently, it is possible to reduce the value of capacitance necessary for the external capacitor Cv.

Embodiment 2

<<The Configuration of the Memory Cell (Embodiment 2)>>

Figure 10:
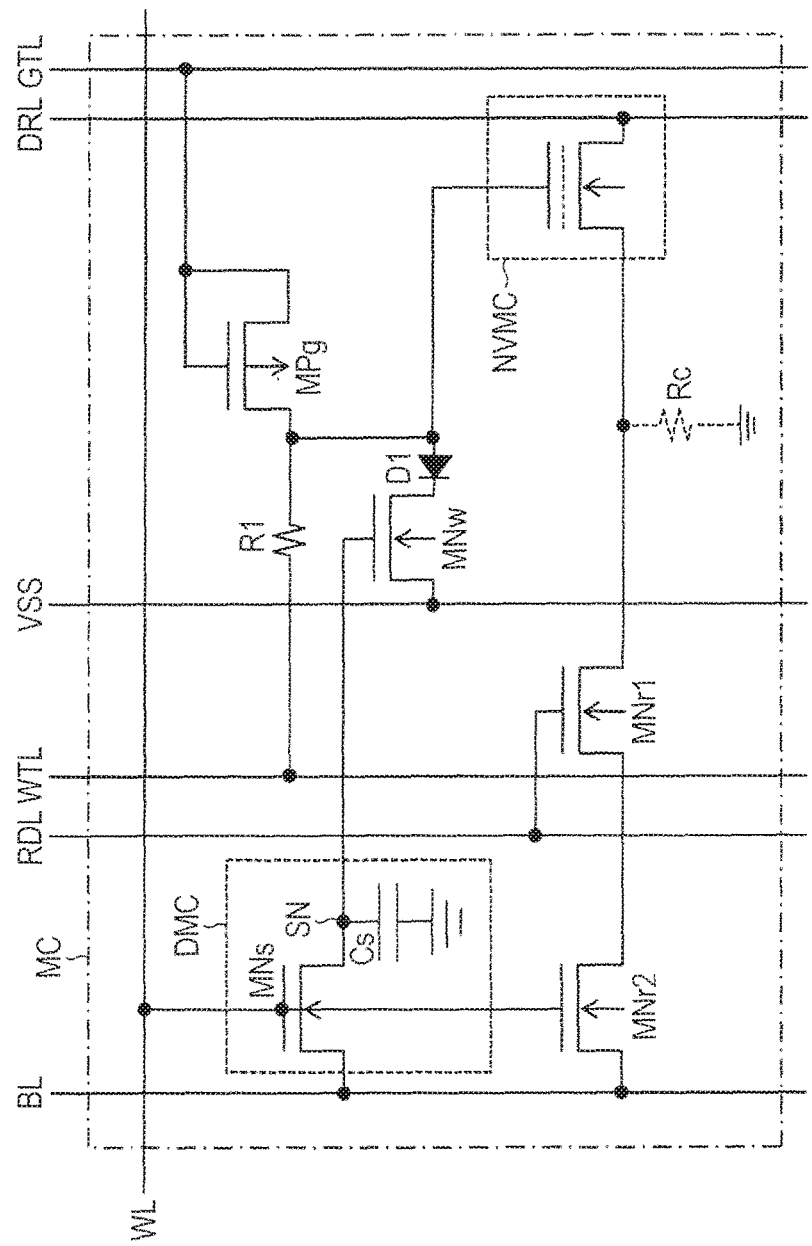
FIG. 10 is a circuit diagram illustrating an example of the configuration of the memory cell illustrated in FIG. 1 in a semiconductor device according to Embodiment 2 of the present invention.

FIG. 10 is a circuit diagram illustrating an example of the configuration of the memory cell illustrated in FIG. 1 in a semiconductor device according to Embodiment 2 of the present invention. The memory cell MC illustrated in FIG. 10 has the configuration in which the amplifier circuit AMP is deleted and a control transistor MNr2 is added, as compared with the example of the configuration illustrated in FIG. 3. The control transistor MNr2 is an NMOS transistor similar to the control transistor MNs in the DRAM cell DMC. The control transistor MNr2 has one end coupled to a predetermined bit line BL, and is controlled to ON according to activation of a predetermined word line WL. The transistor MNr1 is coupled between the other end of the control transistor MNr2 and the nonvolatile memory cell NVMC and transmits the information read from the nonvolatile memory cell NVMC to the control transistor MNr2, in response to the activation of the write-back control line RDL.

<<DRAM Write-Back Processing>>

Figure 11:
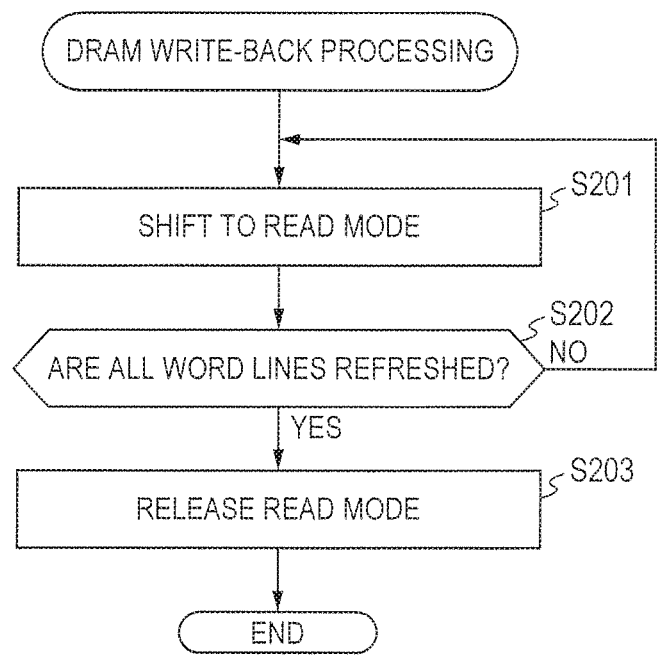
FIG. 11 is a flow chart illustrating an example of the operation when the memory cell illustrated in FIG. 10 performs the DRAM write-back processing illustrated in FIG. 4.
Figure 12:
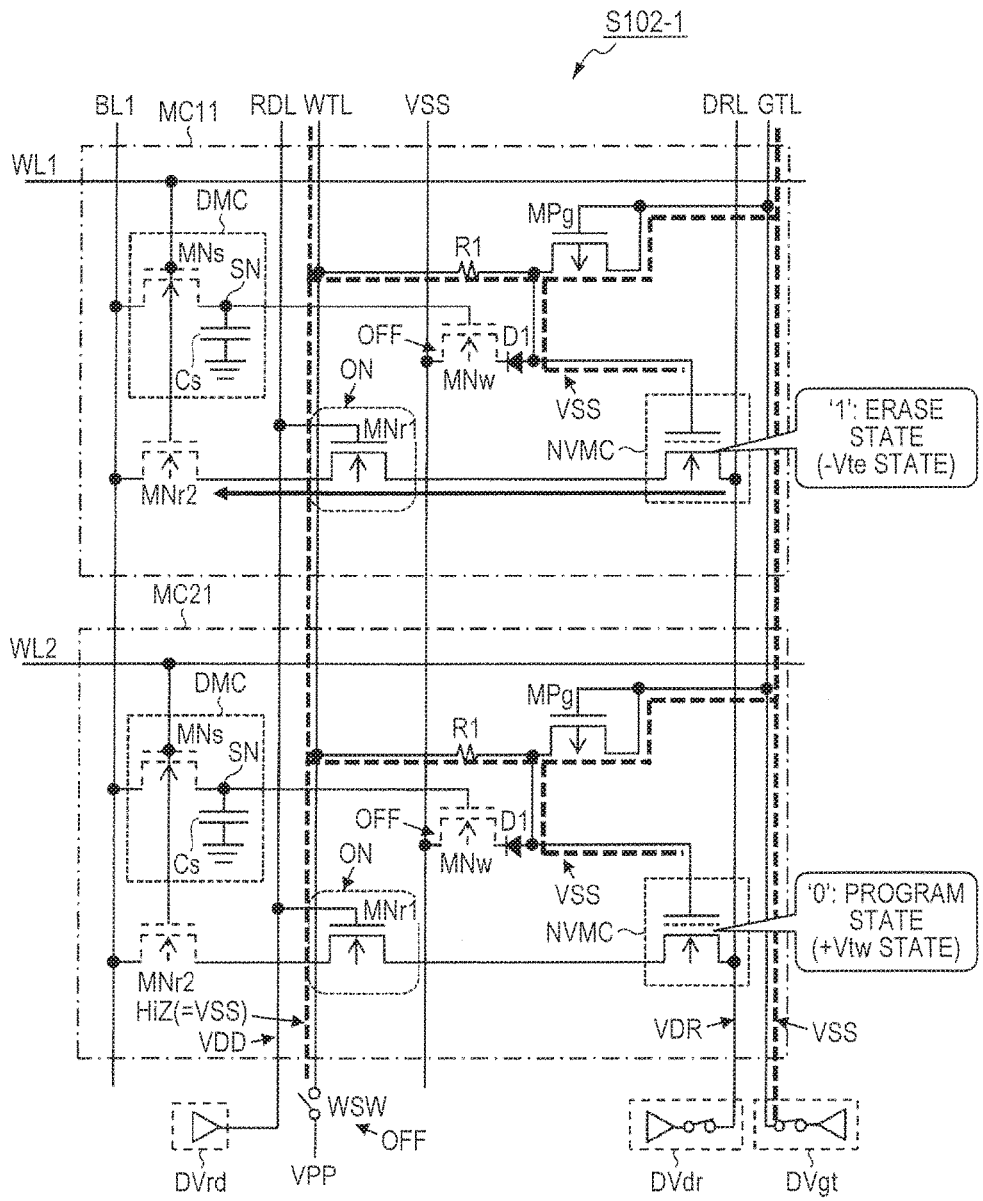
FIG. 12 is a supplementary drawing illustrating a concrete example of the contents of processing illustrated in FIG. 11.
Figure 13:
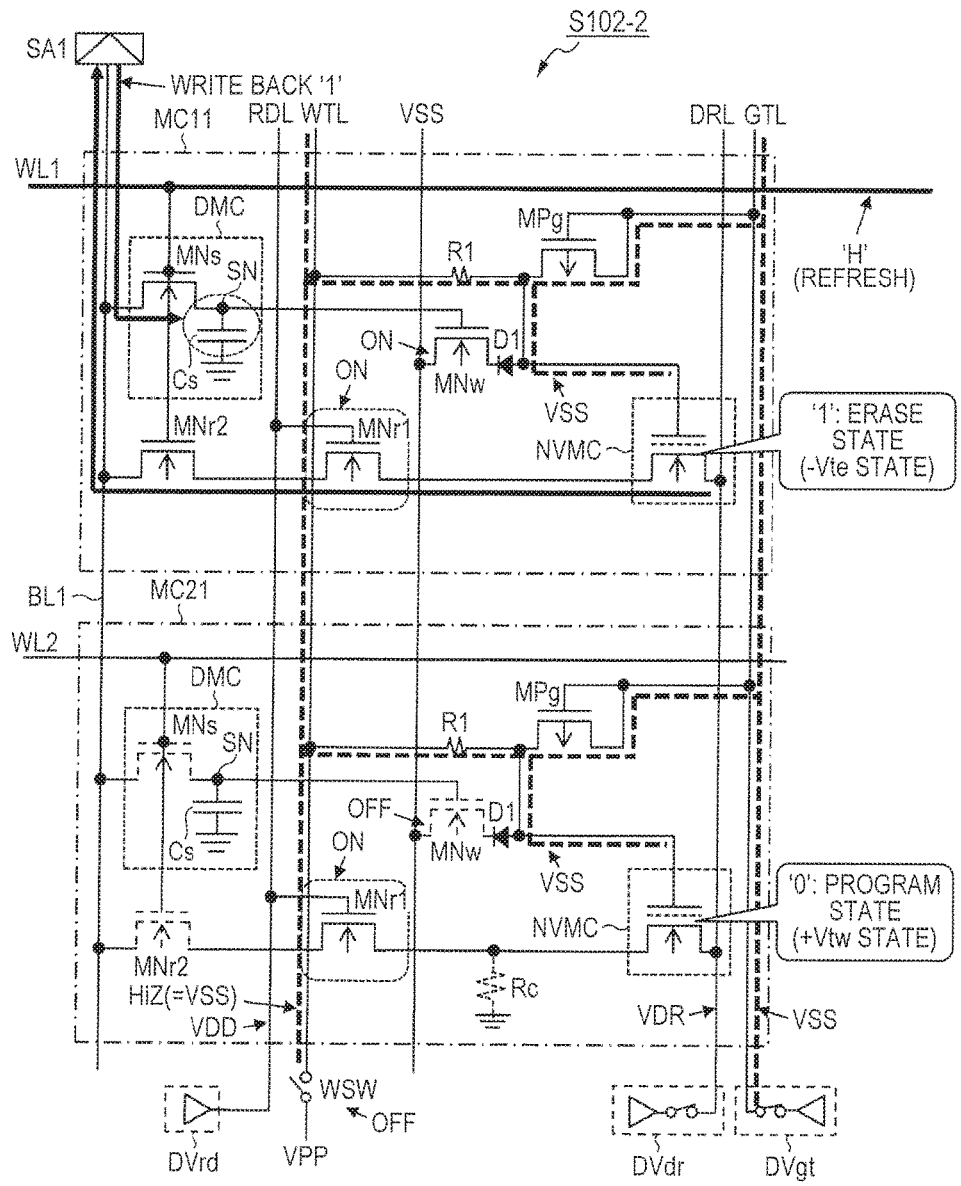
FIG. 13 is a supplementary drawing following FIG. 12.

As compared with the case of FIG. 3, the contents of processing by the memory cell MC illustrated in FIG. 10 are the same in the erasing mode, the standby mode, and the program mode, but different in the read mode. FIG. 11 is a flow chart illustrating an example of the operation when the memory cell illustrated in FIG. 10 performs the DRAM write-back processing (Step S102) illustrated in FIG. 4. FIG. 12 is a supplementary drawing illustrating a concrete example of the contents of processing illustrated in FIG. 11, and FIG. 13 is a supplementary drawing following FIG. 12.

In FIG. 11, the sequencer SEQ illustrated in FIG. 1 shifts to the read mode (the write-back mode) (Step S201). Next, the sequencer SEQ notifies the DRAM controller DMCTL illustrated in FIG. 1 that the sequencer SEQ has shifted to the read mode. In response to the notification, the DRAM controller DMCTL performs the refresh of all the word lines WL (Step S202). Although the details will be described later, in this refresh operation, the memory unit MEM transmits the information read from the nonvolatile memory cell NVMC to the predetermined bit line BL via the transistor MNr1 and the control transistor MNr2, and writes back the information to the storage node SN via the sense amplifier circuit SA.

Subsequently, when the refresh of all the word lines WL has completed, the DRAM controller DMCTL notifies the sequencer SEQ of the completion of the refresh. In response to the notification, the sequencer SEQ releases the read mode (Step S203). Specifically, the sequencer SEQ shifts to the erasing mode, for example.

In FIG. 12, as is the case with FIG. 6, it is assumed that the power supply voltage VDD from the exterior is switched on, in the case where the nonvolatile memory cell NVMC of the memory cell MC11 is in the erase state (the '1' signal), and the nonvolatile memory cell NVMC of the memory cell MC21 is in the write state (the '0' signal). In the DRAM write-back processing (the read mode), as is the case with FIG. 6, the write voltage line WTL is controlled to the HiZ, the terminal control line DRL is driven to the read voltage VDR (for example, 1.5V), and the gate control line GTL is driven to the reference supply voltage VSS. In this state, the write-back control line RDL is driven to the power supply voltage VDD.

The reference supply voltage VSS is applied to the gate of each nonvolatile memory cell NVMC from the gate control line GTL via the transistor MPg. In the memory cell MC11, the nonvolatile memory cell NVMC is in a threshold voltage (−Vte) state (for example, −Vte=−1.5V). Accordingly, the nonvolatile memory cell NVMC is in the state of being ready to make the read current flow. The transistor MNr1 is controlled to ON according to the write-back control line RDL, and is in the state of being ready to make flow the read current of the nonvolatile memory cell NVMC.

As illustrated in FIG. 13, when the word line WL1 is activated clue to the refresh operation in this state, the control transistor MNr2 is controlled to ON, and the bit line BL1 is charged by the read current of the nonvolatile memory cell NVMC from the transistor MNr1. The sense amplifier circuit SA1 amplifies the amount of voltage change accompanying the electric charging of the bit line BL1, and writes back the signal (the '1' signal) of the level of the power supply voltage VDD to the storage node SN via the control transistor MNs.

On the other hand, in FIG. 12 and FIG. 13, the nonvolatile memory cell NVMC of the memory cell MC21 is in the threshold voltage (+Vtw) state (for example, +Vtw=+1.5V). Accordingly, the nonvolatile memory cell NVMC does not make a read current flow. In FIG. 13, if the word line WL2 is activated due to the refresh operation, the bit line BL1 is discharged via the control transistor MNr2 and the transistor MNr1 that are set to ON, and further via the resistive element Rc. The sense amplifier circuit SA1 amplifies the amount of voltage change accompanying the discharge of the bit line BL1, and writes back the signal (the '0' signal) of the level of the reference supply voltage VSS to the storage node SN via the control transistor MNs.

Figure 14:
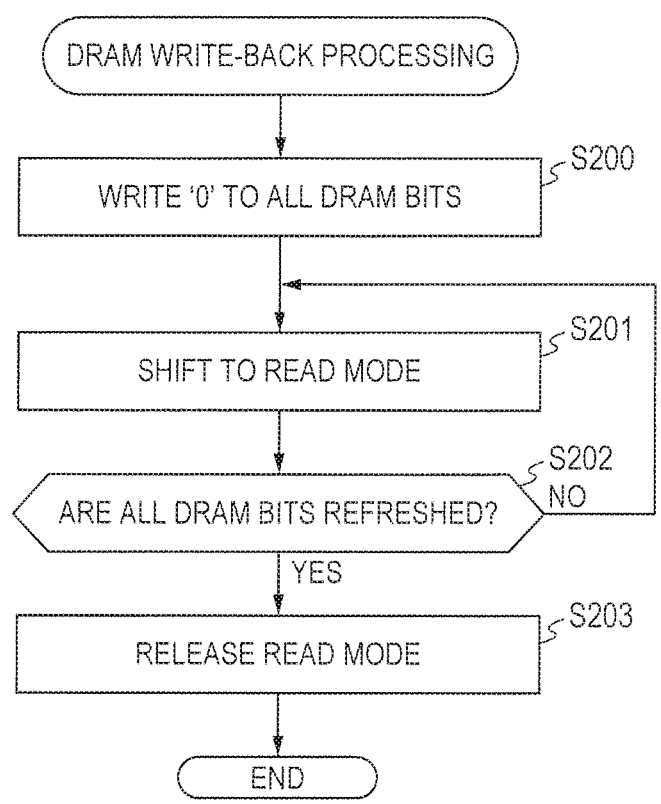
FIG. 14 is a flow chart illustrating an example of the operation of the DRAM write-back processing different from the operation illustrated in FIG. 11.

FIG. 14 is a flow chart illustrating an example of the operation of the DRAM write-back processing (Step S102) different from the operation illustrated in FIG. 11. The flow illustrated in FIG. 14 includes Step S200 before Step S201, as compared with the flow illustrated in FIG. 11. At Step S200, the memory unit MEM writes '0' in all the DRAM cells DMC in advance. Specifically, it is possible to employ a system in which a circuit to perform such processing is provided in the memory unit MEM itself, or a system in which the CPU illustrated in FIG. 2 performs such processing.

By writing '0' into the DRAM cell DMC in advance, it becomes possible to set the storage node SN of the DRAM cell DMC to the '0' signal (in other words to write back the '0' signal to the storage node SN), without employing the resistive element Rc as in the memory cell MC21 illustrated in FIG. 13, for example. In this case, in order to ensure the write-back of the '1' signal such as in the memory cell MC11, each circuit is designed such that the charge current of the bit line BL1 accompanying the read current of the nonvolatile memory cell NVMC becomes greater than the discharge current of the bit line BL1 that occurs accompanying the '0' signal of the storage node SN.

<<Main Effects of Embodiment 2>>

In the above, by employing the semiconductor device according to Embodiment 2 and by performing the write-back processing utilizing the sense amplifier circuit SA, it becomes possible to reduce the circuit scales of each memory cell MC, in addition to the same effect obtained in Embodiment 1. That is, it becomes possible to make the sense amplifier circuit SA originally included in the DRAM carry out the same function as the amplifier circuit AMP illustrated in FIG. 3.

Embodiment 3

<<An Example of the Configuration (Various Kinds of Modified Examples) of the Memory Cell>>

Figure 15:
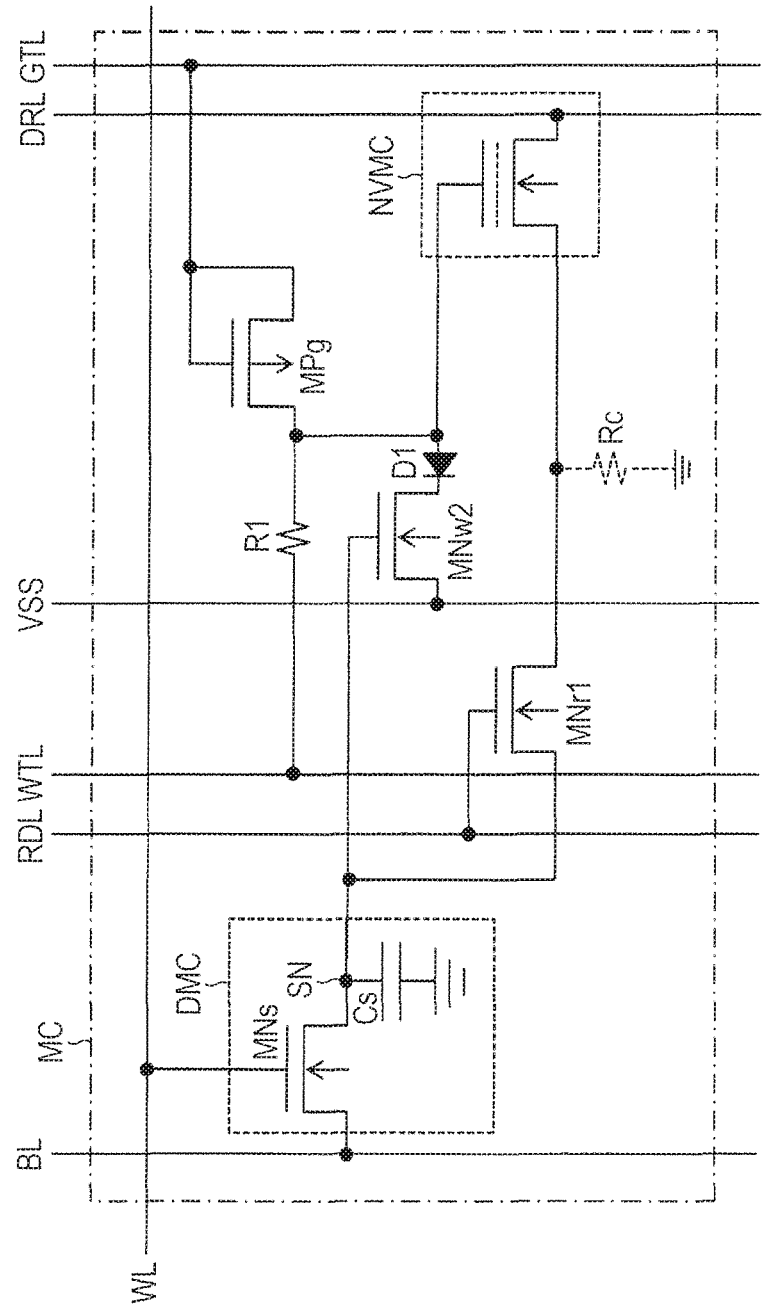
FIG. 15 is a circuit diagram illustrating an example of the configuration of the memory cell illustrated in FIG. 1 in a semiconductor device according to Embodiment 3 of the present invention.

FIG. 15 is a circuit diagram illustrating an example of the configuration of the memory cell illustrated in FIG. 1 in a semiconductor device according to Embodiment 3 of the present invention. The memory cell MC illustrated in FIG. 15 has the configuration in which the amplifier circuit AMP is deleted, as compared with the example of the configuration illustrated in FIG. 3. When writing back the '1' signal to the storage node SN, a sufficient voltage corresponding to the '1' signal can be generated at the source of the nonvolatile memory cell NVMC, depending on the combination of the threshold voltage (−Vte) in the erase state of the nonvolatile memory cell NVMC and the read voltage VDR of the terminal control line DRL. In this case, it becomes possible to reduce the circuit scales of each memory cell MC by deleting the amplifier circuit AMP.

Figure 16:
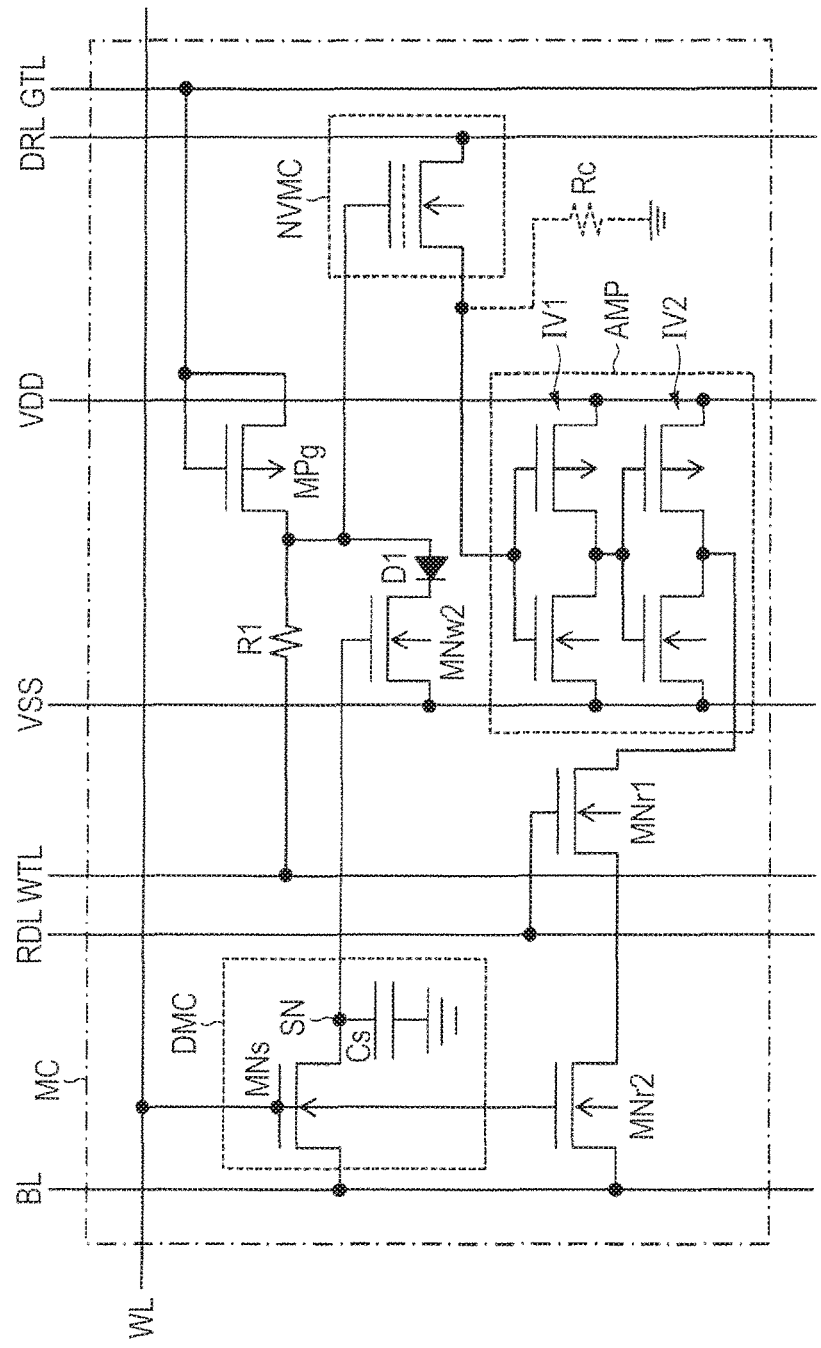
FIG. 16 is a circuit diagram illustrating another example of the configuration of the memory cell illustrated in FIG. 1 in the semiconductor device according to Embodiment 3 of the present invention.

FIG. 16 is a circuit diagram illustrating another example of the configuration of the memory cell illustrated in FIG. 1 in the semiconductor device according Embodiment 3 of the present invention. The memory cell MC illustrated in FIG. 16 has the configuration in which the amplifier circuit AMP is added, as compared with the example of the configuration illustrated in FIG. 10. When a sufficient voltage to determine the potential of the bit line BL cannot be generated at the source of the nonvolatile memory cell NVMC, it is also possible to add the amplifier circuit AMP. In this case, although the circuit scale increases, it becomes possible to improve the reliability in performing the write-back.

Figure 17:
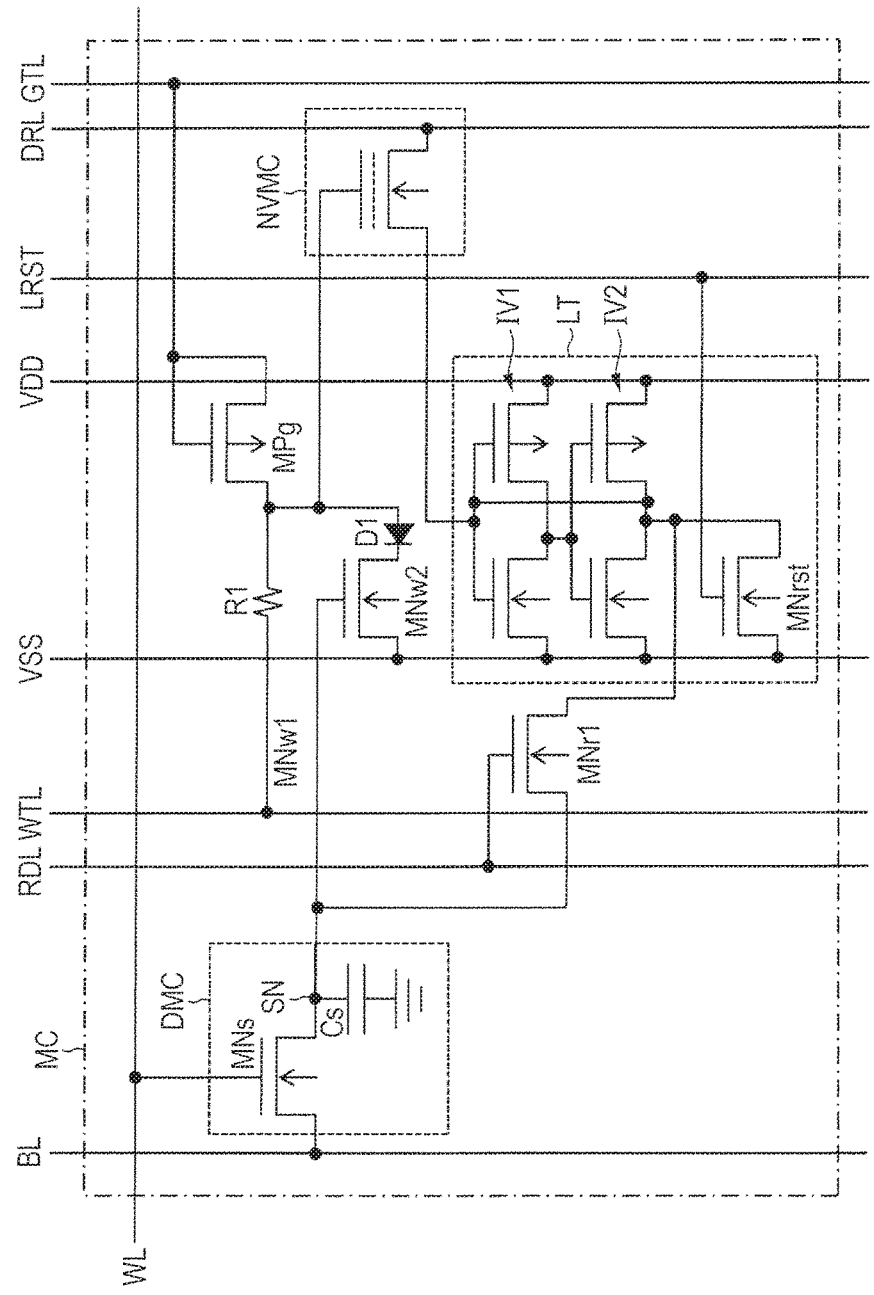
FIG. 17 is a circuit diagram illustrating further another example of the configuration of the memory cell illustrated in FIG. 1 in the semiconductor device according to Embodiment 3 of the present invention.

FIG. 17 is a circuit diagram illustrating further another example of the configuration of the memory cell illustrated in FIG. 1 in the semiconductor device according to Embodiment 3 of the present invention. The memory cell MC illustrated in FIG. 17 has the configuration in which a reset latch circuit LT is included instead of the amplifier circuit AMP, as compared with the example of the configuration illustrated in FIG. 3. In the present configuration, the resistive element Rc is unnecessary. The reset latch circuit LT has a configuration of latching in which an input of one of CMOS inverters IV1 and IV2 is coupled to an output of the other of the CMOS inverters IV1 and IV2.

Furthermore, the reset latch circuit LT includes a transistor MNrst (an NMOS transistor in the present example) for reset. The transistor MNrst is coupled in parallel to the NMOS transistor that composes the CMOS inverter IV2 on the side of the transistor MNr1. The transistor MNrst is controlled to ON according to the activation of the reset line LRST, and initializes both of the coupling node with the transistor MNr1 and the coupling node with the nonvolatile memory cell NVMC to the level of the reference supply voltage VSS.

In the write-back processing (the read mode), the sequencer SEQ illustrated in FIG. 1 performs initialization by activating the reset line LRST first. Next, after deactivating the reset line LRST, the sequencer SEQ performs the same processing as in the case illustrated in FIG. 6. Accordingly, although the procedure at the time of the read mode increases a little, the same effect as in Embodiment 1 is obtained.

As described above, the invention accomplished by the present inventors has been concretely explained based on the embodiments. However, the present invention is not restricted to the embodiments as described above, and it can be changed variously in the range which does not deviate from the gist. For example, the embodiments described above have been explained in detail, in order to facilitate the understanding of the present invention; however, the present invention is not necessarily restricted to one that includes all the configurations explained. It is possible to replace a part of the configuration of one of the embodiments with the configuration of other embodiments, and it is possible to add the configuration of other embodiment to the configuration of one of the embodiments. A part of the configuration of each embodiment can be added with other configuration, deleted, or replaced with the other configuration.

What is claimed is:

1. A semiconductor device comprising:
   a plurality of word lines;
   a plurality of bit lines; and
   a plurality of memory cells coupled to the word lines and the bit lines,
   wherein each of the memory cells comprises:
   a DRAM cell including a capacitor to hold information at a storage node and a first control transistor;
   a nonvolatile memory cell to hold information by use of a first threshold voltage as an erase state and a second threshold voltage as a write state, and to shift to the write state by a write voltage being applied in the erase state; and
   a first transistor to select whether or not to apply the write voltage to the nonvolatile memory cell according to the voltage level at the storage node of the DRAM cell.

2. The semiconductor device according to claim 1 further comprising:

a write voltage line to which the write voltage is applied,
wherein each of the memory cells further comprises:
a resistive element coupled between a gate of the nonvolatile memory cell and the write voltage line and having a value of resistance higher than on-resistance of the first transistor, and
wherein the first transistor is coupled between the gate of the nonvolatile memory cell and a reference supply voltage, and ON/OFF of the first transistor is controlled by the voltage level at the storage node.

3. The semiconductor device according to claim 1 further comprising:
a write-back control line,
wherein each of the memory cells further comprises:
a second transistor coupled between the storage node and the nonvolatile memory cell and to write back information read from the nonvolatile memory cell to the storage node in response to activation of the write-back control line.

4. The semiconductor device according to claim 1 further comprising:
a write-back control line,
wherein each of the memory cells further comprises:
a second control transistor having one end coupled to a bit line shared by the DRAM cell, and controlled to an ON state in response to activation of a word line shared by the DRAM cell; and
a second transistor coupled between the other end of the second control transistor and the nonvolatile memory cell and to transmit information read from the nonvolatile memory cell to the second control transistor in response to activation of the write-back control line.

5. A semiconductor device supplied with a low-potential-side power supply voltage and a high-potential-side power supply voltage, the semiconductor device comprising:
a plurality of word lines;
a plurality of bit lines;
a plurality of memory cells coupled to the word lines and the bit lines; and
a write-back control line,
wherein each of the memory cells comprises:
a DRAM cell including a capacitor to hold information at a storage node and a first control transistor to couple a predetermined bit line to the storage node in response to activation of a predetermined word line;
a nonvolatile memory cell to hold information by use of a first threshold voltage as an erase state and a second threshold voltage as a write state, and to shift to the write state by a write voltage being applied in the erase state;
a first transistor to select whether or not to apply the write voltage to the nonvolatile memory cell according to the voltage level at the storage node of the DRAM cell; and
a second transistor coupled between the storage node and the nonvolatile memory cell and to write back information read from the nonvolatile memory cell to the storage node in response to activation of the write-back control line.

6. The semiconductor device according to claim 5 further comprising:
a write voltage line to which the write voltage is applied; and
a terminal control line coupled to one of the source and the drain of the nonvolatile memory cell,
wherein each of the memory cells further comprises:
a resistive element coupled between a gate of the nonvolatile memory cell and the write voltage line and having a value of resistance higher than on-resistance of the first transistor, and
wherein the first transistor is coupled between a gate of the nonvolatile memory cell and the low-potential-side power supply voltage, and ON/OFF of the first transistor is controlled by a voltage level at the storage node.

7. The semiconductor device according to claim 6,
wherein each of the memory cells further comprises:
an amplifier circuit provided between the other of the source and the drain of the nonvolatile memory cell and the second transistor, and to output a voltage corresponding to the level of '1' or '0' of the storage node, according to whether a read current flows through the nonvolatile memory cell.

8. The semiconductor device according to claim 6 further comprising:
a gate control line to which an erase voltage is applied to shift the nonvolatile memory cell to the erase state,
wherein each of the memory cells further comprises:
a third transistor coupled between a gate of the nonvolatile memory cell and the gate control line, and controlled to an ON state when shifting the nonvolatile memory cell to the erase state.

9. The semiconductor device according to claim 8,
wherein the third transistor is a diode-connected transistor with an anode on the side of the gate of the nonvolatile memory cell and a cathode on the side of the gate control line.

10. The semiconductor device according to claim 8,
wherein each of the memory cells further comprises:
a diode coupled between a gate of the nonvolatile memory cell and the first transistor and having an anode on the side of the gate of the nonvolatile memory cell and a cathode on the side of the first transistor.

11. The semiconductor device according to claim 8,
wherein when reading information from the nonvolatile memory cell, the semiconductor device applies the low-potential-side power supply voltage to the gate of the nonvolatile memory cell via one of the write voltage line and the gate control line, and applies a predetermined read voltage to the terminal control line.

12. A semiconductor device supplied with a low-potential-side power supply voltage and a high-potential-side power supply voltage, the semiconductor device comprising:
a plurality of word lines;
a plurality of bit lines;
a plurality of sense amplifier circuits coupled to the bit lines and to amplify voltages of the bit lines;
a plurality of memory cells coupled to the word lines and the bit lines; and
a write-back control line,
wherein each of the memory cells comprises:
a DRAM cell including a capacitor to hold information at a storage node and a first control transistor to couple a predetermined bit line to the storage node in response to activation of a predetermined word line;
a nonvolatile memory cell to hold information by use of a first threshold voltage as an erase state and a second threshold voltage as a write state, and to shift to the write state by a write voltage being applied in the erase state;

a first transistor to select whether or not to apply the write voltage to the nonvolatile memory cell according to the voltage level at the storage node of the DRAM cell;

a second control transistor having one end coupled to the predetermined bit line, and controlled to an ON state in response to activation of the predetermined word line; and a second transistor coupled between the other end of the second control transistor and the nonvolatile memory cell and to transmit information read from the nonvolatile memory cell to the second control transistor in response to activation of the write-back control line.

13. The semiconductor device according to claim 12, wherein when performing a refresh operation to the predetermined word line, the semiconductor device transmits information read from the nonvolatile memory cell to the predetermined bit line via the second transistor and the second control transistor, and writes back the information to the storage node via the sense amplifier circuit of the predetermined bit line.

14. The semiconductor device according to claim 12 further comprising:

a write voltage line to which the write voltage is applied; and a terminal control line coupled to one of the source and the drain of the nonvolatile memory cell, wherein each of the memory cells further comprises:

a resistive element coupled between a gate of the nonvolatile memory cell and the write voltage line and having a value of resistance higher than on-resistance of the first transistor, and wherein the first transistor is coupled between a gate of the nonvolatile memory cell and the low-potential-side power supply voltage, and ON/OFF of the first transistor is controlled by a voltage level at the storage node.

15. The semiconductor device according to claim 14 further comprising:

a gate control line to which an erase voltage is applied to shift the nonvolatile memory cell to the erase state, wherein each of the memory cells further comprises:

a third transistor coupled between a gate of the nonvolatile memory cell and the gate control line, and controlled to an ON state when shifting the nonvolatile memory cell to the erase state.

16. The semiconductor device according to claim 15, wherein each of the memory cells further comprises:

a diode coupled between a gate of the nonvolatile memory cell and the first transistor and having an anode on the side of the gate of the nonvolatile memory cell and a cathode on the side of the first transistor.

17. The semiconductor device according to claim 15, wherein when reading information from the nonvolatile memory cell, the semiconductor device applies the low-potential-side power supply voltage to the gate of the nonvolatile memory cell via one of the write voltage line and the gate control line, and applies the predetermined read voltage to the terminal control line.

* * * * *